US009431545B2

United States Patent
Saito et al.

(10) Patent No.: US 9,431,545 B2
(45) Date of Patent: Aug. 30, 2016

(54) SEMICONDUCTOR DEVICE AND METHOD FOR MANUFACTURING THE SAME

(75) Inventors: Toshihiko Saito, Atsugi (JP); Atsuo Isobe, Isehara (JP); Kazuya Hanaoka, Fujisawa (JP); Junichi Koezuka, Tochigi (JP); Shinya Sasagawa, Chigasaki (JP); Motomu Kurata, Isehara (JP); Akihiro Ishizuka, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 161 days.

(21) Appl. No.: 13/604,962

(22) Filed: Sep. 6, 2012

(65) Prior Publication Data

US 2013/0075732 A1    Mar. 28, 2013

(30) Foreign Application Priority Data

Sep. 23, 2011  (JP) .................................. 2011-208229
Oct. 13, 2011  (JP) .................................. 2011-225519

(51) Int. Cl.
H01L 29/786    (2006.01)
H01L 21/28     (2006.01)
H01L 27/12     (2006.01)

(52) U.S. Cl.
CPC ....... *H01L 29/7869* (2013.01); *H01L 27/1225* (2013.01)

(58) Field of Classification Search
CPC ............. H01L 27/1225; H01L 27/124; H01L 29/786; H01L 29/78693; H01L 29/78606; H01L 29/41733; H01L 29/66969; H01L 29/4908; H01L 29/78696; H01L 29/78; H01L 29/78666; H01L 29/42384; H01L 21/28; H01L 21/336; H01L 21/84; H01L 21/4763; H01L 51/0021; H01L 29/78621; H01L 29/78675; H01L 29/6676; H01L 29/423848; H01L 27/1203
USPC ................... 257/57, 347, E27.112, E21.535; 438/163
See application file for complete search history.

(56) References Cited

U.S. PATENT DOCUMENTS 5,459,090 A * 10/1995 Yamazaki ........... H01L 27/1214
                                                       257/408
5,528,032 A    6/1996 Uchiyama
(Continued)

FOREIGN PATENT DOCUMENTS

CN    001540731 A    10/2004
EP    1737044 A      12/2006
(Continued)

OTHER PUBLICATIONS

Morosawa.N. et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

(Continued)

*Primary Examiner* — Julia Slutsker
*Assistant Examiner* — Natalia Gondarenko
(74) *Attorney, Agent, or Firm* — Robinson Intellectual Property Law Office; Eric J. Robinson

(57) ABSTRACT

A miniaturized transistor having high electric characteristics is provided with high yield. In a semiconductor device including the transistor, high performance, high reliability, and high productivity are achieved. In a semiconductor device including a transistor in which an oxide semiconductor film, a gate insulating film, and a gate electrode layer on side surfaces of which sidewall insulating layers are provided are stacked in this order, source and drain electrode layers are provided in contact with the oxide semiconductor film and the sidewall insulating layers. In a process for manufacturing the semiconductor device, a conductive film and an interlayer insulating film are stacked to cover the oxide semiconductor film, the sidewall insulating layers, and the gate electrode layer, and the interlayer insulating film and the conductive film over the gate electrode layer are removed by a chemical mechanical polishing method, so that the source and drain electrode layers are formed.

8 Claims, 22 Drawing Sheets

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,242,343 B1 | 6/2001 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,126,174 B2* | 10/2006 | Segawa et al. | 257/288 |
| 7,211,825 B2 | 5/2007 | Shih et al | |
| 7,247,562 B2 | 7/2007 | Ishikawa | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,003,981 B2 | 8/2011 | Iwasaki et al. | |
| 8,164,090 B2 | 4/2012 | Iwasaki et al. | |
| 8,198,680 B2 | 6/2012 | Ishikawa | |
| 8,207,025 B2 | 6/2012 | Suzawa et al. | |
| 8,247,813 B2 | 8/2012 | Koyama et al. | |
| 8,637,864 B2* | 1/2014 | Saito et al. | 257/43 |
| 8,643,008 B2 | 2/2014 | Yamazaki et al. | |
| 9,171,919 B2 | 10/2015 | Ishikawa | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0017303 A1* | 1/2005 | Ishikawa | 257/347 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057331 A1* | 3/2007 | Satou et al. | 257/384 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0265416 A1* | 10/2008 | Lee et al. | 257/751 |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140053 A1* | 6/2009 | Yamazaki et al. | 235/492 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0298247 A1* | 12/2009 | Kim | 438/294 |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0155721 A1* | 6/2010 | Lee et al. | 257/43 |
| 2011/0086475 A1* | 4/2011 | Yamazaki et al. | 438/162 |
| 2011/0089417 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0122670 A1 | 5/2011 | Yamazaki et al. | |
| 2011/0136301 A1 | 6/2011 | Yamazaki et al. | |
| 2011/0136302 A1 | 6/2011 | Yamazaki et al. | |
| 2011/0156023 A1* | 6/2011 | Ieda | 257/43 |
| 2011/0163311 A1 | 7/2011 | Akimoto et al. | |
| 2011/0175087 A1 | 7/2011 | Yamazaki et al. | |
| 2011/0194331 A1* | 8/2011 | Kawae et al. | 365/149 |
| 2011/0204362 A1 | 8/2011 | Akimoto et al. | |
| 2011/0212569 A1 | 9/2011 | Yamazaki et al. | |
| 2011/0212570 A1 | 9/2011 | Yamazaki et al. | |
| 2011/0250724 A1 | 10/2011 | Suzawa et al. | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0269266 A1 | 11/2011 | Yamazaki | |
| 2012/0018727 A1 | 1/2012 | Endo et al. | |
| 2012/0032161 A1 | 2/2012 | Matsubayashi | |
| 2012/0034743 A1 | 2/2012 | Suzawa et al. | |
| 2012/0061670 A1 | 3/2012 | Suzawa et al. | |
| 2012/0112184 A1 | 5/2012 | Yamazaki et al. | |
| 2012/0146019 A1 | 6/2012 | Yamazaki et al. | |
| 2012/0149147 A1 | 6/2012 | Yamazaki et al. | |
| 2012/0161121 A1 | 6/2012 | Yamazaki | |
| 2012/0161123 A1 | 6/2012 | Yamazaki | |
| 2012/0161124 A1 | 6/2012 | Yamazaki | |

(56) References Cited

U.S. PATENT DOCUMENTS

| | | |
|---|---|---|
| 2012/0161126 A1 | 6/2012 | Yamazaki |
| 2012/0187397 A1 | 7/2012 | Yamazaki et al. |
| 2012/0286260 A1 | 11/2012 | Noda et al. |
| 2012/0286262 A1 | 11/2012 | Koyama et al. |
| 2012/0315730 A1 | 12/2012 | Koezuka et al. |
| 2012/0315735 A1 | 12/2012 | Koezuka et al. |
| 2012/0319113 A1 | 12/2012 | Yamazaki |
| 2013/0075733 A1 | 3/2013 | Saito et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-074526 | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-096055 A | 4/2007 |
| JP | 2009-224479 A | 10/2009 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 5th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5) $InGaO_3(ZnO)3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters). Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 42, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

(56) References Cited

OTHER PUBLICATIONS

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digeset of Technical Papers, May 31, 2009, pp. 983-985.

Sakata.J et al., "Development of 4.0-IN. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, PP. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous IN—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID Interantional Symposium Digest of Technical Papers, 2007, vol. 38, pp. 1830-1833.

Godo.H et al., "P-9:Numerical Analysis on Temperature Dependence of Characteristics of Amorphous In—Ga—ZN—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposim Digest of Technial Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on ELectron Devices, Jul. 1, 1995, Vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Taiwanese Office Action (Application No. 101133490) Dated Dec. 15, 2015.

* cited by examiner

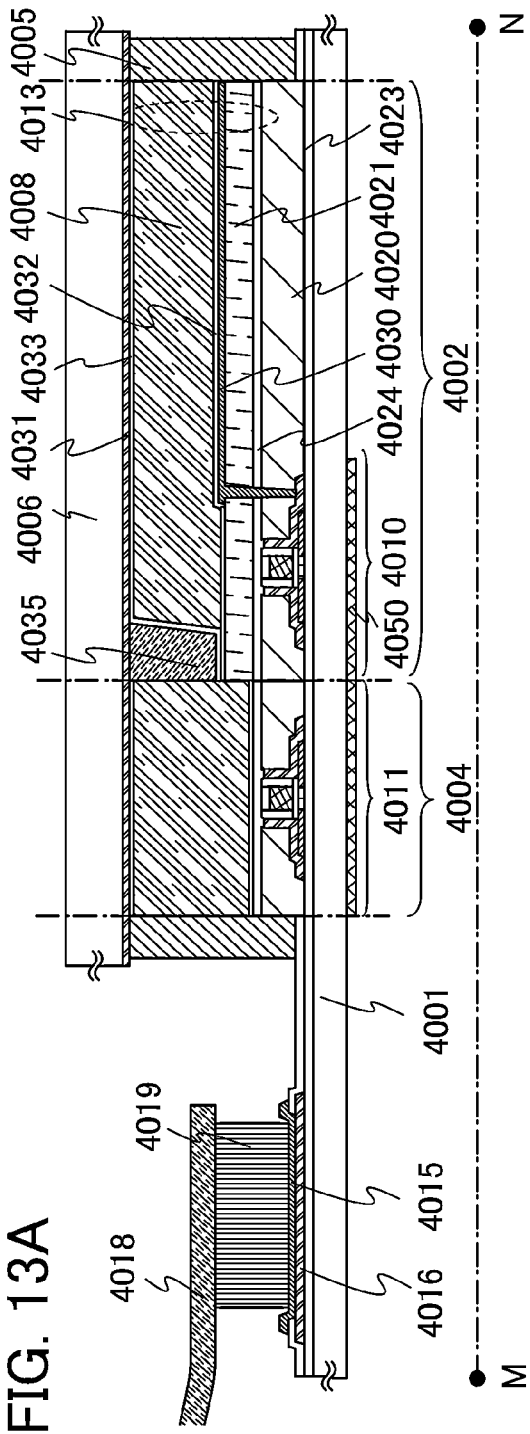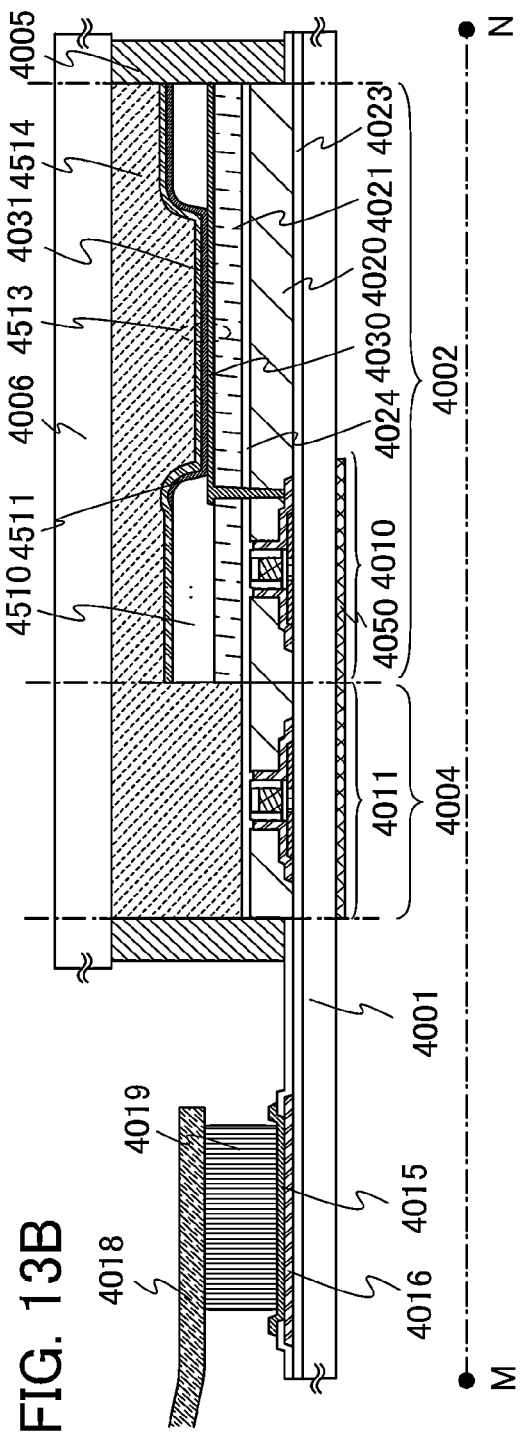

SEMICONDUCTOR DEVICE AND METHOD FOR MANUFACTURING THE SAME

BACKGROUND OF THE INVENTION

1. Field of the Invention

An embodiment of the present invention relates to a semiconductor device and a method for manufacturing the semiconductor device.

In this specification, a semiconductor device generally means a device which can function by utilizing semiconductor characteristics, and an electro-optical device, a semiconductor circuit, and an electronic device are all semiconductor devices.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) is disclosed (see Patent Document 1).

REFERENCE

[Patent Document 1] Japanese Published Patent Application No. 2006-165528

SUMMARY OF THE INVENTION

In order to achieve high-speed operation, low power consumption, high integration, or the like of a transistor, it is necessary to miniaturize a transistor.

One object of an embodiment of the present invention is to provide a structure of a semiconductor device which achieves high-speed response and high-speed operation by improving on-state characteristics of a miniaturized transistor (e.g., on-state current or field-effect mobility), and to provide a manufacturing method thereof, in order to achieve a high-performance semiconductor device.

Further, in accordance with miniaturization of the transistor, concern about a decrease in yield of a manufacturing process rises.

Accordingly, it is another object to provide a miniaturized transistor having high electric characteristics with high yield.

Further, another object of an embodiment of the present invention is to achieve high performance, high reliability, and high productivity also in the semiconductor device including the transistor.

In a semiconductor device including a transistor in which an oxide semiconductor film, a gate insulating film, and a gate electrode layer on side surfaces of which sidewall insulating layers are provided are stacked in this order, a source electrode layer and a drain electrode layer are provided in contact with the oxide semiconductor film and the sidewall insulating layers. In a process for manufacturing the semiconductor device, a conductive film and an interlayer insulating film are stacked to cover the oxide semiconductor film, the sidewall insulating layers, and the gate electrode layer. Then, the interlayer insulating film and the conductive film are cut (grinded or polished), so that the conductive film over the gate electrode layer is removed. Accordingly, a source electrode layer and a drain electrode layer are formed. As the cutting (grinding or polishing) method, a chemical mechanical polishing (CMP) method can be preferably used.

Precise processing can be performed accurately because an etching step using a resist mask is not performed in a step for removing the conductive film over the gate electrode layer, which is one step of the formation process of the source electrode layer and the drain electrode layer. Consequently, in a process for manufacturing the semiconductor device, a transistor having a miniaturized structure with less variation in shape or characteristics can be manufactured with high yield.

Further, an insulating film is preferably provided over the gate electrode layer. Part or all of the insulating film may be removed in a step for removing part of the conductive film which is to be a source electrode layer and a drain electrode layer and provided over the insulating film.

Low-resistance regions whose resistances are lower than that of the channel formation region and which include a dopant are formed in the oxide semiconductor film so that the channel formation region is sandwiched between the low-resistance regions, by introducing the dopant into the oxide semiconductor film in a self-aligned manner with the use of the gate electrode layer as a mask. The dopant is an impurity by which the conductivity of the oxide semiconductor film is changed. As the method for introduction the dopant, an ion implantation method, an ion doping method, a plasma immersion ion implantation method, or the like can be used.

With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

An embodiment of the invention disclosed in this specification is a semiconductor device including an oxide semiconductor film including a channel formation region provided over an oxide insulating film, a gate insulating film over the oxide semiconductor film, stacked layers of a gate electrode layer and an insulating film over the gate insulating film, sidewall insulating layers covering side surfaces of the gate electrode layer and side surfaces of the insulating film, a source electrode layer and a drain electrode layer in contact with the oxide semiconductor film, side surfaces of the gate insulating film, and side surfaces of the sidewall insulating layers, and an interlayer insulating film over the source electrode layer and the drain electrode layer. In the semiconductor device, the height of a top surface of the source electrode layer and the height of a top surface of drain electrode layer are lower than the height of a top surface of the insulating film, the height of a top surface of the sidewall insulating layers, and the height of a top surface of the interlayer insulating film, and higher than the height of a top surface of the gate electrode layer. Further, in the oxide semiconductor film, a region which does not overlap with the gate electrode layer and includes a region overlapping with the gate insulating film includes a dopant.

In the above-described structure, an embodiment of the invention disclosed in this specification is a semiconductor device in which the height of the top surface of the insulating film, the height of the top surface of the sidewall insulating layers, and the height of the top surface of the interlayer insulating film are the same.

In addition, in the oxide semiconductor film, a region which does not overlap with the source electrode layer or the drain electrode layer may have a higher oxygen concentration than a region which overlaps with the source electrode layer or the drain electrode layer.

An embodiment of the invention disclosed in this specification is a method for manufacturing a semiconductor device including the following steps of: forming an oxide insulating film; forming an oxide semiconductor film over the oxide insulating film; forming a gate insulating film over the oxide semiconductor film; stacking a gate electrode layer and an insulating film overlapping with the oxide semiconductor film over the gate insulating film; selectively introducing a dopant into the oxide semiconductor film with the use of the gate electrode layer and the insulating film as masks; forming sidewall insulating layers covering side surfaces of the gate electrode layer and side surfaces of the insulating film over the gate insulating film; forming a conductive film over the oxide semiconductor film, the gate insulating film, the gate electrode layer, the insulating film, and the sidewall insulating layers; forming an interlayer insulating film over the conductive film; and forming a source electrode layer and a drain electrode layer by removing the interlayer insulating film and the conductive film by a chemical mechanical polishing method until the insulating film over the gate electrode layer is exposed and the conductive film is divided.

In the above structure, an inorganic insulating film (typically an aluminum oxide film) which has high density and which is to be a protective insulating film may be provided over the insulating film, the source electrode layer, the drain electrode layer, the sidewall insulating layers, and the interlayer insulating film.

In the above structure, an inorganic insulating film (typically an aluminum oxide film) which has high density and which is to be a protective insulating film may be provided between the source electrode layer and the interlayer insulating film and between the drain electrode layer and the interlayer insulating film.

In addition to the cutting (grinding or polishing) method such as a chemical mechanical polishing method, etching (dry etching or wet etching) method, plasma treatment, or the like may be employed in combination in the step of removing the conductive film over the gate electrode layer. For example, after the removing step by a chemical mechanical polishing method, a dry etching method or plasma treatment may be performed in order to improve the planarity of a surface to be processed.

In the above structure, planarization treatment may be performed on a surface of the oxide insulating film over which the oxide semiconductor film is to be formed. The oxide semiconductor film having small thickness can be provided with good coverage. As the planarization treatment, a chemical mechanical polishing method, an etching method, plasma treatment, or the like or a combination of these can be employed.

Further, heat treatment (dehydration or dehydrogenation treatment) by which hydrogen or moisture is eliminated from the oxide semiconductor film may be performed on the oxide semiconductor film. When a crystalline oxide semiconductor film is used as the oxide semiconductor film, heat treatment for crystallization may be performed.

Further, oxygen may be supplied to the oxide semiconductor film. The dehydration or dehydrogenation treatment may accompany elimination of oxygen which is a main constituent material of an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Thus, oxygen is preferably supplied to the oxide semiconductor film after being subjected to the dehydration or dehydrogenation treatment. By introduction of oxygen to the oxide semiconductor film, an oxygen vacancy in the film can be filled.

For example, an oxide insulating film including much (excessive) oxygen, which serves as a supply source of oxygen, may be provided to be in contact with the oxide semiconductor film, whereby oxygen can be supplied from the oxide insulating film to the oxide semiconductor film. In the above structure, heat treatment may be performed in the state where the oxide semiconductor film after being subjected to the heat treatment as the dehydration or dehydrogenation treatment and the oxide insulating film are at least partly in contact with each other to supply oxygen to the oxide semiconductor film.

Further, oxygen (which includes at least one of an oxygen radical, an oxygen atom, and an oxygen ion) may be introduced to the oxide semiconductor film after being subjected to the dehydration or dehydrogenation treatment to supply oxygen to the oxide semiconductor film. As the method for introduction of oxygen, an ion implantation method, an ion doping method, a plasma immersion ion implantation method, plasma treatment, or the like can be used.

Further, it is preferable that the oxide semiconductor film in the transistor include a region where the oxygen content is higher than that in the stoichiometric composition of the oxide semiconductor in a crystalline state. In that case, the oxygen content is higher than that in the stoichiometric composition of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to fill an oxygen vacancy therein, the oxide semiconductor can be turned into an i-type (intrinsic) oxide semiconductor or a substantially i-type (intrinsic) oxide semiconductor. Accordingly, the Fermi level (Ef) of the oxide semiconductor can be changed to the same level as the intrinsic Fermi level (Ei). Thus, by using the oxide semiconductor film for a transistor, variation in the threshold voltage $V_{th}$ of the transistor due to an oxygen vacancy and a shift of the threshold voltage $\Delta V_{th}$ can be reduced.

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

Accordingly, a miniaturized transistor having high electric characteristics can be provided with high yield.

Further, also in a semiconductor device including the transistor, high performance, high reliability, and high productivity can be achieved.

BRIEF DESCRIPTION OF THE DRAWINGS

FIGS. 13A and 13B are cross-sectional views each illustrating an embodiment of a semiconductor device.

DETAILED DESCRIPTION OF THE INVENTION

Embodiments of the invention disclosed in this specification are described in detail below with reference to drawings. Note that the invention disclosed in this specification is not limited to the description below, and it is easily understood by those skilled in the art that modes and details of the present invention can be modified in various ways. In addition, the invention disclosed in this specification should not be construed as being limited to the description in the embodiments given below. Note that ordinal numbers such as "first" and "second" are used for convenience and do not denote the order of steps or the stacking order of layers. In addition, the ordinal numbers in this specification do not denote any particular names to define the invention.

Embodiment 1

In this embodiment, an embodiment of a semiconductor device and a method for manufacturing the semiconductor device are described with reference to FIGS. 1A and 1B and the like. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
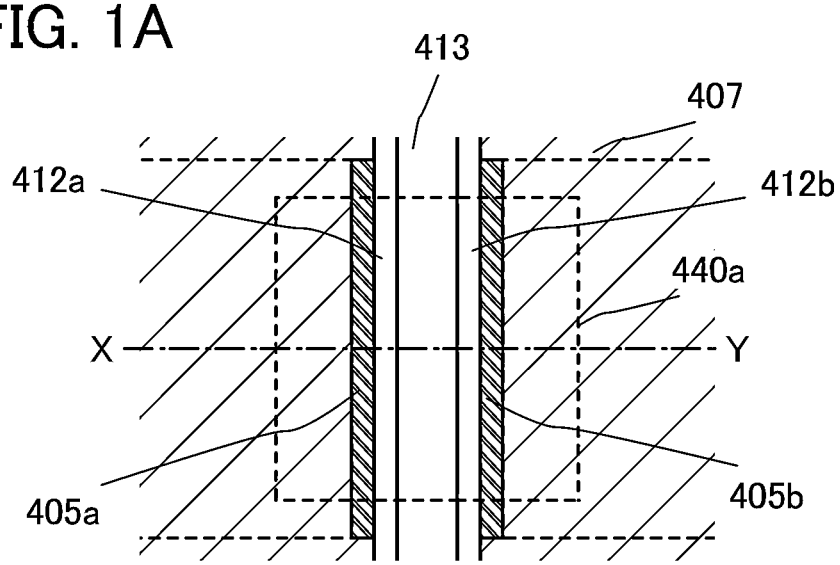
FIGS. 1A and 1B are a plan view and a cross-sectional view illustrating an embodiment of a semiconductor device.
Figure 1B:
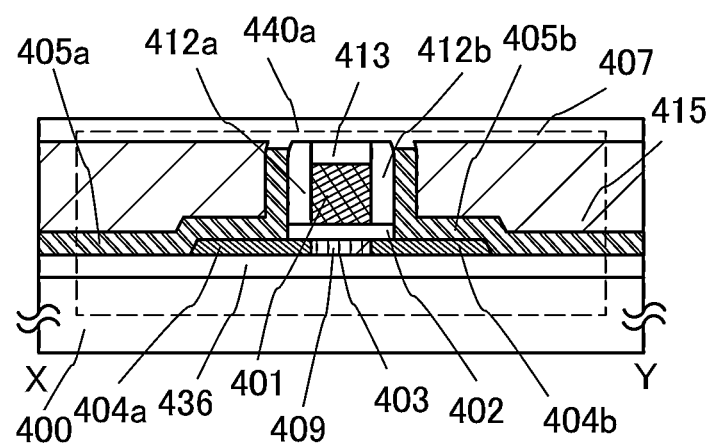

A transistor 440a illustrated in FIGS. 1A and 1B is an example of a top-gate transistor. FIG. 1A is a plan view and FIG. 1B is a cross-sectional view along dashed line X-Y in FIG. 1A.

As illustrated in FIG. 1B, which is a cross-sectional view in the channel length direction, a semiconductor device including the transistor 440a includes, over a substrate 400 having an insulating surface over which an oxide insulating film 436 is provided, an oxide semiconductor film 403 including a channel formation region 409 and low-resistance regions 404a and 404b, a source electrode layer 405a, a drain electrode layer 405b, a gate insulating film 402, a gate electrode layer 401, sidewall insulating layers 412a and 412b provided on side surfaces of the gate electrode layer 401, an insulating film 413 over the gate electrode layer 401, an interlayer insulating film 415 over the source electrode layer 405a and the drain electrode layer 405b, and an insulating film 407 covering the transistor 440a.

The interlayer insulating film 415 is provided for planarizing unevenness due to the transistor 440a, and the height of a top surface of the interlayer insulating film 415 is substantially the same as that of each of the sidewall insulating layers 412a and 412b and the insulating film 413. Further, the height of each of the top surface of the source electrode layer 405a and the drain electrode layer 405b is lower than the height of each of the top surface of the interlayer insulating film 415, the sidewall insulating layers 412a and 412b, and the insulating film 413, and higher than the height of a top surface of the gate electrode layer 401. Note that "height" here means a distance from a top surface of the substrate 400.

Further, in FIGS. 1A and 1B, the insulating film 407 is provided in contact with the interlayer insulating film 415, the source electrode layer 405a, the drain electrode layer 405b, the sidewall insulating layers 412a and 412b, and the insulating film 413.

A dopant is introduced into the oxide semiconductor film 403 in a self-aligned manner with the use of the gate electrode layer 401 as a mask, so that the low-resistance regions 404a and 404b between which the channel formation region 409 is sandwiched, which have lower resistances than the channel formation region 409, and which include a dopant are formed in the oxide semiconductor film 403. The dopant is an impurity by which the conductivity of the oxide semiconductor film 403 is changed. As the method for introducing the dopant, an ion implantation method, an ion doping method, a plasma immersion ion implantation method, or the like can be used.

With the oxide semiconductor film 403 including the low-resistance regions 404a and 404b between which the channel formation region 409 is provided in the channel length direction, on-state characteristics (e.g., on-state current and field-effect mobility) of the transistor 440a are increased, which enables high-speed operation and high-speed response of the transistor.

An oxide semiconductor used for the oxide semiconductor film 403 preferably contains at least indium (In) or zinc (Zn). In particular, In and Zn are preferably contained. In addition, as a stabilizer for reducing the variation in electric characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

The oxide semiconductor film 403 can be in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and layers each including metal atoms and oxygen atoms are overlapped with each other. Note that the direction of a normal vector of the layers is a c-axis direction. Note that, among crystal parts, the directions of the a-axis and the b-axis of one crystal part may be different from those of another crystal part. In this specification, a simple term "perpendicular" includes a range from 85° to 95°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when impurities are introduced to the CAAC-OS film, the crystal part in a region to which the impurities are introduced becomes amorphous in some cases.

Since the c-axes of the crystal parts included in the CAAC-OS film are aligned in the direction perpendicular to the surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction perpendicular to the surface where the CAAC-OS film is formed or the surface of the CAAC-OS film. The crystal part is formed by film formation or by performing treatment for crystallization such as heat treatment after film formation.

With use of the CAAC-OS film in a transistor, a change in the electric characteristics of the transistor due to irradiation with visible light or ultraviolet light can be reduced. Thus, the transistor has high reliability.

Note that part of oxygen included in the oxide semiconductor film may be substituted with nitrogen.

Further, in an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that the average surface roughness (Ra) is obtained by expanding, into three dimensions, arithmetic mean surface roughness that is defined by JIS B 0601: 2001 (ISO4287: 1997) to be able to apply it to a curved surface. Ra can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

Here, the specific surface is a surface which is a target of roughness measurement, and is a quadrilateral region which is specified by four points represented by the coordinates $((x_1, y_1, f(x_1, y_1)), (x_1, y_2, f(x_1, y_2)), (x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs film formation in the state where top surfaces of a plurality of substrates are set substantially perpendicular to a surface of a sputtering target.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the formation of the CAAC-OS film, the following conditions are preferably used.

By reducing the amount of impurities entering the CAAC-OS film during the film formation, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the film formation, migration of a sputtered particle is likely to occur after the sputtered particle reaches a substrate surface. Specifically, the substrate heating temperature during the film formation is higher than or equal to 100° C. and lower than or equal to 740° C., preferably higher than or equal to 200° C. and lower than or equal to 500° C. By increasing the substrate heating temperature during the film formation, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the film formation. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

An example of a method for manufacturing a semiconductor device including the transistor 440a is described with reference to FIGS. 2A to 2D and FIGS. 3A to 3D.

First, the oxide insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate. Alternatively, the transistor 440a including the oxide semiconductor film 403 may be formed over a substrate, and then may be separated and transferred to a flexible substrate. Note that in order to separate the transistor 440a from the manufacturing substrate and transfer it to the flexible substrate, a separation layer is preferably provided between the manufacturing substrate and the transistor 440a including the oxide semiconductor film.

The oxide insulating film 436 can be formed by a plasma CVD method, a sputtering method, or the like using any of silicon oxide, silicon oxynitride, aluminum oxide, aluminum oxynitride, hafnium oxide, gallium oxide, or a mixed material thereof.

The oxide insulating film 436 may have either a single-layer structure or a stacked-layer structure. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

In this embodiment, a silicon oxide film formed by a sputtering method is used as the oxide insulating film 436.

Further, a nitride insulating film may be provided between the oxide insulating film 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

Figure 2A:
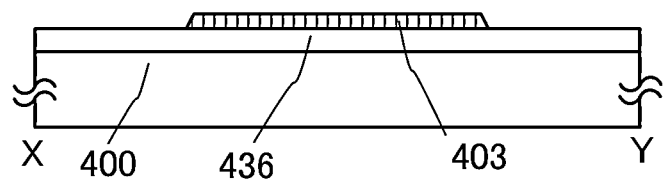
FIGS. 2A to 2D are cross-sectional views illustrating an embodiment of a method for manufacturing a semiconductor device.

Next, the oxide semiconductor film 403 is formed over the oxide insulating film 436 (see FIG. 2A).

The oxide insulating film 436 is in contact with the oxide semiconductor film 403 and therefore preferably contains a large amount of oxygen which exceeds at least the stoichiometric composition in (a bulk of) the film. For example, in the case where a silicon oxide film is used as the oxide insulating film 436, the composition formula is $SiO_{2+\alpha}$ ($\alpha>0$). By using the oxide insulating film 436 described above, oxygen can be supplied to the oxide semiconductor film 403 and favorable characteristics can be obtained. By supplying oxygen to the oxide semiconductor film 403, an oxygen vacancy in the film can be filled.

For example, when the oxide insulating film 436 containing much (excess) oxygen, which serves as an oxygen supply source, is provided to be in contact with the oxide semiconductor film 403, oxygen can be supplied from the oxide insulating film 436 to the oxide semiconductor film 403. The oxide semiconductor film 403 and the oxide insulating film 436 may be subjected to heating treatment in a state where the oxide semiconductor film 403 and the oxide insulating film 436 are at least partly in contact with each other so that oxygen is supplied to the oxide semiconductor film 403.

In order that hydrogen or water is not contained in the oxide semiconductor film 403 as much as possible in the formation process of the oxide semiconductor film 403, it is preferable to heat the substrate provided with the oxide insulating film 436 in a preheating chamber in a sputtering apparatus as a pretreatment for formation of the oxide semiconductor film 403 so that impurities such as hydrogen and moisture adsorbed to the substrate and the oxide insulating film 436 are eliminated and evacuated. As an exhaustion unit provided in the preheating chamber, a cryopump is preferable.

Planarizing treatment may be performed on a region of the oxide insulating film 436 which is in contact with the oxide semiconductor film 403. As the planarizing treatment, polishing treatment (e.g., a chemical mechanical polishing method), dry-etching treatment, or plasma treatment can be used, though there is no particular limitation on the planarizing treatment.

As the plasma treatment, for example, a reverse sputtering in which an argon gas is introduced and plasma is produced can be performed. The reverse sputtering is a method in which voltage is applied to a substrate side with use of an RF power source in an argon atmosphere and plasma is generated in the vicinity of the substrate so that a substrate surface is modified. Instead of the argon atmosphere, a nitrogen atmosphere, a helium atmosphere, an oxygen atmosphere, or the like may be used. The reverse sputtering can remove particle substances (also referred to as particles or dust) attached to a surface of the oxide insulating film 436.

As the planarizing treatment, polishing treatment, dry-etching treatment, or plasma treatment may be performed plural times and/or in combination. Further, in the case where the treatments are combined, the order of steps of such a combination is not particularly limited and may be set as appropriate in accordance with roughness of the surface of the oxide insulating film 436.

Planarizing treatment may be performed on a surface of the silicon oxide film used as the oxide insulating film 436 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness (Ra) of the surface of the silicon oxide film is preferably approximately 0.15 nm.

The oxide semiconductor film 403 is preferably formed under a condition such that much oxygen is contained (for example, by a sputtering method in an atmosphere of 100% oxygen) to be a film containing much oxygen (preferably having a region containing an excess of oxygen as compared to the stoichiometric composition of the oxide semiconductor in a crystalline state).

Note that in this embodiment, as a target for forming the oxide semiconductor film 403 by a sputtering method, an oxide target containing In, Ga, and Zn in the atomic ratio of 3:1:2 is used to form an In—Ga—Zn-based oxide film (IGZO film).

The relative density (filling factor) of the metal oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which impurities such as hydrogen, water, a hydroxyl group, or hydride are removed be used as a sputtering gas for the formation of the oxide semiconductor film 403.

The substrate is held in a deposition chamber kept under reduced pressure. Then, a sputtering gas in which hydrogen and moisture are removed is introduced into the deposition chamber from which remaining moisture is being removed, so that the oxide semiconductor film 403 is formed over the substrate 400 with the use of the target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The oxide insulating film 436 and the oxide semiconductor film 403 are preferably formed in succession without exposure to the air. According to successive formation of the oxide insulating film 436 and the oxide semiconductor film 403 without exposure to the air, impurities such as hydrogen and moisture can be prevented from being adsorbed onto the surface of the oxide insulating film 436.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas of $BCL_3$ and $Cl_2$ ($BCL_3:Cl_2$=60 sccm:20 sccm), a power of 450 W, a bias power of 100 W, and a pressure of 1.9 Pa), so that the IGZO film is processed into an island shape.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of a substrate. The heat treatment can be performed under reduced pressure, a nitrogen atmosphere, or the like. For example, the substrate is put in an electric furnace which is a kind of heat treatment apparatus, and the oxide semiconductor film 403 is subjected to heat treatment at 450° C. for one hour in a nitrogen atmosphere.

Further, the heat treatment apparatus is not limited to the electric furnace, and a device for heating an object by heat conduction or heat radiation from a heating element such as a resistance heating element may also be used. For example, a rapid thermal anneal (RTA) apparatus such as a gas rapid thermal anneal (GRTA) apparatus or a lamp rapid thermal anneal (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment with a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated to high temperature of 650° C. to 700° C., heated for several minutes, and taken out of the inert gas.

In the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or more, further preferably 7N (99.99999%) or more (that is, the impurity concentration is preferably 1 ppm or less, further preferably 0.1 ppm or less).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not included in the oxygen gas or the dinitrogen monoxide gas. The purity of the oxygen gas or the dinitrogen monoxide gas which is introduced into the heat treatment apparatus is preferably 6N or more, further preferably 7N or more (that is, the impurity concentration in the oxygen gas or the dinitrogen monoxide gas is preferably 1 ppm or less, further preferably 0.1 ppm or less). The oxygen gas or the dinitrogen monoxide gas acts to supply oxygen that is a main constituent material of the oxide semiconductor and that is reduced by the step for removing impurities for dehydration or dehydrogenation, so that the oxide semiconductor film 403 can be a highly-purified, i-type (intrinsic) oxide semiconductor film.

The heat treatment for dehydration or dehydrogenation may be performed after a film-shaped oxide semiconductor film is formed or after the island-shaped oxide semiconductor film 403 is formed.

The heat treatment for dehydration or dehydrogenation may be performed plural times and may also serve as another heat treatment.

When the heat treatment for dehydration or dehydrogenation is performed in the state where the oxide insulating film 436 is covered with the oxide semiconductor film which has not been processed into the island-shaped oxide semiconductor film 403, oxygen contained in the oxide insulating film 436 can be prevented from being released by the heat treatment, which is preferable.

Further, oxygen (which includes at least one of an oxygen radical, an oxygen atom, and an oxygen ion) may be introduced to the oxide semiconductor film 403 after being subjected to the dehydration or dehydrogenation treatment to supply oxygen to the oxide semiconductor film.

The dehydration or dehydrogenation treatment may accompany elimination of oxygen which is a main constituent material of an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Oxygen is introduced to the dehydrated or dehydrogenated oxide semiconductor film 403 to be supplied thereto, so that the oxide semiconductor film 403 can be highly purified and be i-type (intrinsic). Variation in electric characteristics of a transistor having a highly-purified and i-type (intrinsic) oxide semiconductor film 403 is suppressed, and the transistor is electrically stable.

Oxygen can be introduced by an ion implantation method, an ion doping method, a plasma immersion ion implantation method, plasma treatment, or the like.

In the step of introduction of oxygen to the oxide semiconductor film 403, oxygen may be directly introduced to the oxide semiconductor film 403 or to the oxide semiconductor film 403 through another film such as the gate insulating film 402 or the insulating film 407. An ion implantation method, an ion doping method, a plasma immersion ion implantation method, or the like can be employed for the introduction of oxygen through another film, whereas plasma treatment or the like can also be employed for the direct introduction of oxygen to the exposed oxide semiconductor film 403.

The introduction of oxygen to the oxide semiconductor film 403 is preferably performed after dehydration or dehydrogenation treatment is performed thereon, but the timing is not limited thereto. Further, oxygen may be introduced plural times into the dehydrated or dehydrogenated oxide semiconductor film 403.

Figure 2B:
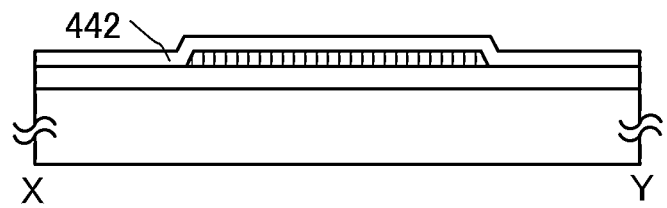

Next, a gate insulating film 442 is formed to cover the oxide semiconductor film 403 (see FIG. 2B).

To improve the coverage with the gate insulating film 442, the above-described planarizing treatment may be performed also on the surface of the oxide semiconductor film 403. It is preferable that the flatness of the surface of the oxide semiconductor film 403 be good particularly when the thickness of the gate insulating film 442 is small.

The gate insulating film 442 has a thickness greater than or equal to 1 nm and less than or equal to 20 nm and can be formed by a sputtering method, an MBE method, a CVD method, a pulse laser deposition method, an ALD method, or the like as appropriate. The gate insulating film 442 may also be formed with a sputtering apparatus which performs film formation in the state where surfaces of a plurality of substrates are substantially perpendicular to a surface of a sputtering target.

The gate insulating film 442 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 442 include oxygen in a portion which is in contact with the oxide semiconductor film 403. In particular, the gate insulating film 442 preferably contains an excess amount of oxygen which exceeds at least the stoichiometric composition in the film (bulk); for example, in the case where a silicon oxide film is used as the gate insulating film 442, the composition formula is $SiO_{2+\alpha}$ ($\alpha > 0$). In this embodiment, a silicon oxide film of $SiO_{2+\alpha}$ ($\alpha > 0$) is used as the gate insulating film 442. By using the silicon oxide film as the gate insulating film 442, oxygen can be supplied to the oxide semiconductor film 403, leading to good characteristics. Further, the gate insulating film 442 is preferably formed in consideration of the size of a transistor to be formed and the step coverage with the gate insulating film 442.

When the gate insulating film 442 is formed using a high-k material such as hafnium oxide, yttrium oxide, hafnium silicate ($HfSi_xO_y$ (x>0, y>0)), hafnium silicate to which nitrogen is added ($HfSi_xO_yN_Y$ (x>0, y>0)), hafnium aluminate ($HfAl_xO_y$ (x>0, y>0)), or lanthanum oxide, gate leakage current can be reduced. Further, the gate insulating film 442 has either a single-layer structure or a stacked-layer structure.

Figure 2C:
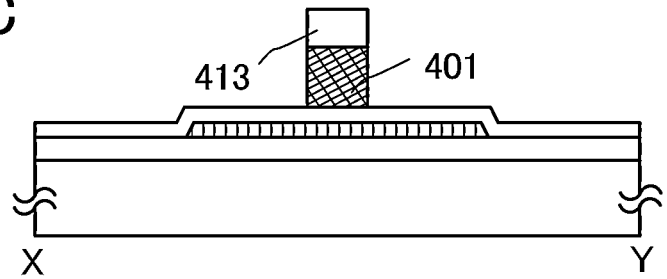

Next, stacked layers of the conductive film and the insulating film are formed over the gate insulating film 442, and are etched, so that stacked layers of the gate electrode layer 401 and the insulating film 413 are formed (see FIG. 2C).

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 442, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV (electron volts); thus, when these are used as the gate electrode layer, the threshold voltage of the electrical characteristics of the transistor can be positive. Accordingly, a so-called normally-off switching element can be obtained.

As the insulating film 413, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 413 can be formed by a plasma CVD method, a sputtering method, or the like.

Figure 2D:
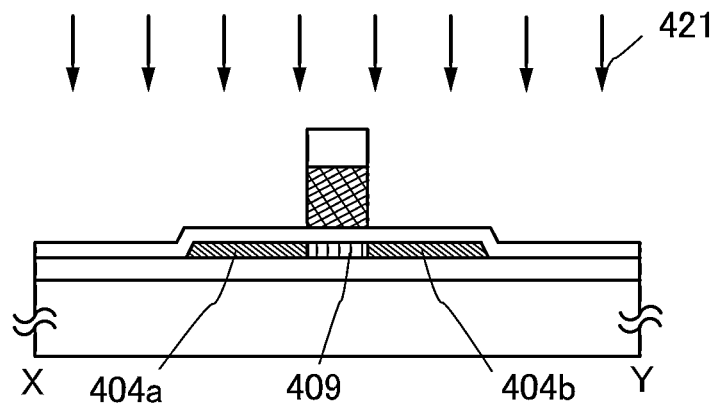

Next, a dopant 421 is introduced into the oxide semiconductor film 403 with the use of the gate electrode layer 401 and the insulating film 413 as masks, so that the low-resistance regions 404a and 404b are formed (see FIG. 2D).

The dopant 421 is an impurity by which the conductivity of the oxide semiconductor film 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 421 can be introduced into the oxide semiconductor film 403 through another film (e.g., the gate insulating film 442) by an implantation method. As the method for adding the dopant 421, an ion implantation method, an ion doping method, a plasma immersion ion implantation method, or the like can be used. In that case, it is preferable to use a single ion of the dopant 421, a fluoride ion, or a chloride ion.

The introduction of the dopant 421 may be controlled by setting the introduction conditions such as the accelerated voltage and the dosage, or the thickness of the films through which the dopant passes as appropriate. In this embodiment, phosphorus is used as the dopant 421, and boron ions are implanted by an ion implantation method. The dosage of the dopant 421 can be set to be greater than or equal to $1\times10^{13}$ ions/cm$^2$ and less than or equal to $5\times10^{16}$ ions/cm$^2$.

The concentration of the dopant 421 in the low-resistance regions is preferably greater than or equal to $5\times10^{18}$/cm$^3$ and less than or equal to $1\times10^{22}$/cm$^3$.

The dopant 421 may be introduced while the substrate 400 is heated.

The introduction of the dopant 421 into the oxide semiconductor film 403 may be performed plural times, and the number of kinds of dopant may be plural.

Further, heat treatment may be performed thereon after the introduction of the dopant 421. The heat treatment is preferably performed at a temperature higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In this embodiment, phosphorus (P) ions are implanted into the oxide semiconductor film 403 by an ion implantation method. Note that the conditions of the phosphorus (P) ion implantation are as follows: the acceleration voltage is 30 kV and the dosage is $1.0\times10^{15}$ ions/cm$^2$.

When the oxide semiconductor film 403 is a CAAC-OS film, the oxide semiconductor film 403 is partly amorphized by introduction of the dopant 421 in some cases. In that case, the crystallinity of the oxide semiconductor film 403 can be recovered by performing heat treatment thereon after the introduction of the dopant 421.

Thus, the oxide semiconductor film 403 in which the low-resistance regions 404a and 404b between which the channel formation region 409 is sandwiched are formed.

Next, an insulating film is formed over the gate electrode layer 401 and the insulating film 413, and the insulating film is etched, so that the sidewall insulating layers 412a and 412b are formed. Further, the gate insulating film 442 is etched with the use of the gate electrode layer 401 and the sidewall insulating layers 412a and 412b as masks, so that the gate insulating film 402 is formed (see FIG. 3A).

The sidewall insulating layers 412a and 412b can be formed using a material and a method similar to those of the insulating film 413. In this embodiment, a silicon oxynitride film formed by a CVD method is used.

Next, a conductive film for forming a source electrode layer and a drain electrode layer (including a wiring formed of the same layer as the source electrode layer and the drain electrode layer) is formed over the oxide semiconductor film 403, the gate insulating film 402, the gate electrode layer 401, the sidewall insulating layers 412a and 412b, and the insulating film 413.

The conductive film is formed of a material that can withstand heat treatment performed later. As the conductive film used for the source electrode layer and the drain electrode layer, for example, a metal film containing an element selected from Al, Cr, Cu, Ta, Ti, Mo, and W, a metal nitride film containing any of the above elements as its component (a titanium nitride film, a molybdenum nitride film, or a tungsten nitride film), or the like can be used. A metal film having a high melting point made of Ti, Mo, W, or the like or a metal nitride film made of any of these elements (a titanium nitride film, a molybdenum nitride film, or a tungsten nitride film) may be stacked on one of or both of a lower side and an upper side of a metal film made of Al, Cu, or the like. Alternatively, the conductive film used for the source electrode layer and the drain electrode layer may be formed of a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

A resist mask is formed over the conductive film by a photolithography process, and the conductive film is selectively etched, so that an island-shaped conductive film 445 is formed. Then, the resist mask is removed. Note that in this etching step, the conductive film 445 over the gate electrode layer 401 is not removed.

When a 30-nm-thick tungsten film is used as the conductive film, the tungsten film may be etched by a dry etching method to have an island shape (the etching conditions: an etching gas of $CF_4$, $Cl_2$, and $O_2$ ($CF_4$:$Cl_2$:$O_2$=55 sccm:45 sccm:55 sccm, a power of 3000 W, a bias power of 140 W, and a pressure of 0.67 Pa).

Figure 3A:
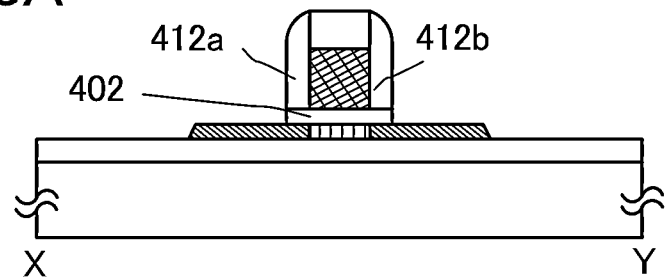
FIGS. 3A to 3D are cross-sectional views illustrating an embodiment of a method for manufacturing a semiconductor device.
Figure 3B:
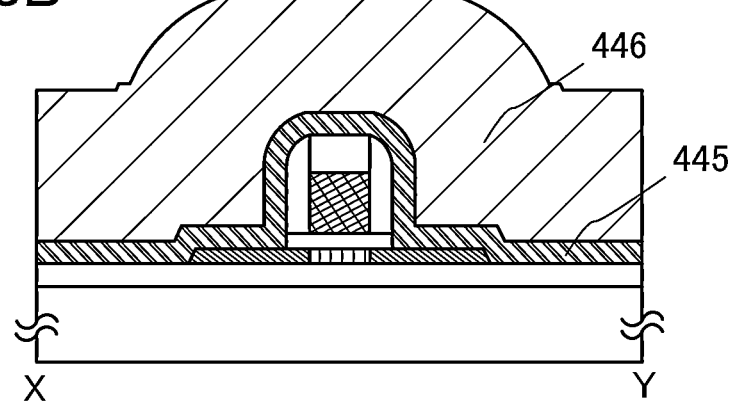

An insulating film 446 to be the interlayer insulating film 415 is stacked over the island-shaped conductive film 445 (see FIG. 3B).

The insulating film 446 can be formed using a material and a method similar to those of the insulating film 413. The insulating film 446 is formed to have a thickness which is large enough to planarize unevenness caused by the transistor 440a. In this embodiment, a 300-nm-thick silicon oxynitride film is formed by a CVD method.

Next, polishing treatment is performed on the insulating film 446 and the conductive film 445 by a chemical mechanical polishing method. Part of the insulating film 446 and part of the conductive film 445 are removed so that the insulating film 413 is exposed.

By the polishing treatment, the insulating film 446 is processed to be the interlayer insulating film 415 and the conductive film 445 over the gate electrode layer 401 is removed; thus, the source electrode layer 405a and the drain electrode layer 405b are formed.

A chemical mechanical polishing method is used for removing the insulating film 446 and the conductive film 445 in this embodiment; however, another cutting (grinding or polishing) method may be used. Further, in addition to the cutting (grinding or polishing) method such as a chemical mechanical polishing method, etching (dry etching or wet etching), plasma treatment, or the like may be employed in combination for the step of removing the conductive film 445 over the gate electrode layer 401. For example, after the removing step by a chemical mechanical polishing method, a dry etching method or plasma treatment (e.g., reverse sputtering method) may be performed in order to improve the planarity of a surface to be processed. When the cutting (grinding or polishing) method is employed in combination with an etching method, plasma treatment, or the like, the order of steps is not particularly limited and may be set as appropriate depending on the materials, the film thicknesses, and the surface roughness of the insulating film 446 and the conductive film 445.

Note that in this embodiment, the source electrode layer 405a and the drain electrode layer 405b are provided in contact with side surfaces of the sidewall insulating layers 412a and 412b provided on side surfaces of the gate electrode layer 401, and the source electrode layer 405a and the drain electrode layer 405b each of which has an upper end portion positioned a little lower than those of the sidewall insulating layers 412a and 412b cover the side surfaces of the sidewall insulating layers 412a and 412b. The shapes of the source electrode layer 405a and the drain electrode layer 405b depend on the conditions of the polishing treatment for removing the conductive film 445, and in some cases, as shown in this embodiment, the source electrode layer 405a and the drain electrode layer 405b are depressed in the film thickness direction from the surfaces of the sidewall insulating layers 412a and 412b and the insulating film 413 on which polishing treatment is performed. However, depending on the conditions of the polishing treatment, the height of each of the top ends of the source electrode layer 405a and the drain electrode layer 405b is almost equal to that of each of the top ends of the sidewall insulating layers 412a and 412b in some cases.

Figure 3C:
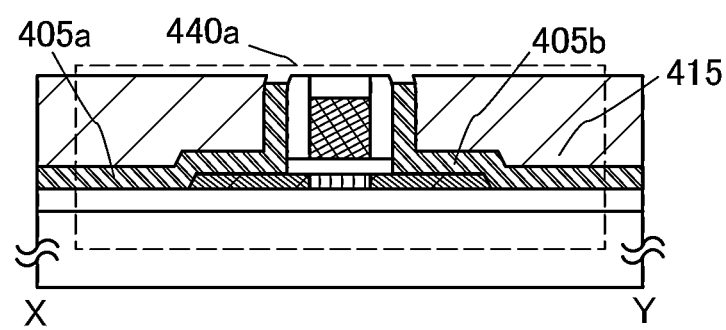

Through the above process, the transistor 440a of this embodiment can be manufactured (see FIG. 3C).

In the manufacturing process of the transistor 440a, the conductive film 445 provided over the gate electrode layer 401, the insulating film 413, and the sidewall insulating layers 412a and 412b is removed by chemical mechanical polishing treatment, so that the conductive film 445 is divided; thus, the source electrode layer 405a and the drain electrode layer 405b are formed.

Further, the source electrode layer 405a and the drain electrode layer 405b are provided in contact with the exposed portion of a top surface of the oxide semiconductor film 403 and the sidewall insulating layers 412a and 412b. The distance (minimum distance) between the gate electrode layer 401 and a region (contact region) in which the oxide semiconductor film 403 is in contact with the source electrode layer 405a or the drain electrode layer 405b corresponds to a width of the sidewall insulating layer 412a or 412b in the channel length direction, whereby the further miniaturization can be achieved and variation in the manufacturing process can be suppressed.

Accordingly, the distance between the gate electrode layer 401 and the region (contact region) in which the oxide semiconductor film 403 is in contact with the source electrode layer 405a or the drain electrode layer 405b can be made short, so that the resistance between the gate electrode layer 401 and the region (contact region) in which the oxide semiconductor film 403 is in contact with the source electrode layer 405a or the drain electrode layer 405b is reduced; thus, the on-state characteristics of the transistor 440a can be improved.

Further, precise processing can be performed accurately because an etching step using a resist mask is not performed in a step for removing the conductive film 445 over the gate electrode layer 401, which is one step of the formation process of the source electrode layer 405a and the drain electrode layer 405b. Consequently, in a process for manufacturing the semiconductor device, the transistor 440a having a miniaturized structure with less variation in shape or characteristics can be manufactured with high yield.

Figure 4A:
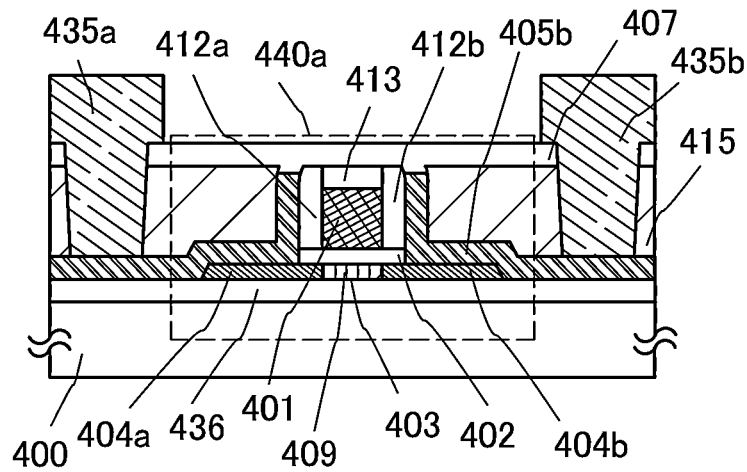
FIGS. 4A to 4C are cross-sectional views each illustrating an embodiment of a semiconductor device.

In the step for removing the conductive film 445 over the gate electrode layer 401, which is one step of the formation process of the source electrode layer 405a and the drain electrode layer 405b, part or all of the insulating film 413 may be removed. FIG. 4C illustrates an example of a transistor 440c in which all of the insulating film 413 is removed and the gate electrode layer 401 is exposed. Further, an upper part of the gate electrode layer 401 may also be removed. A structure in which the gate electrode layer 401 is removed as in the transistor 440c can be used for an integrated circuit in which another wiring or another semiconductor element is stacked over the transistor 440c.

A highly dense inorganic insulating film (typically an aluminum oxide film) which is to be a protective insulating film may be provided over the transistor 440a.

Figure 3D:
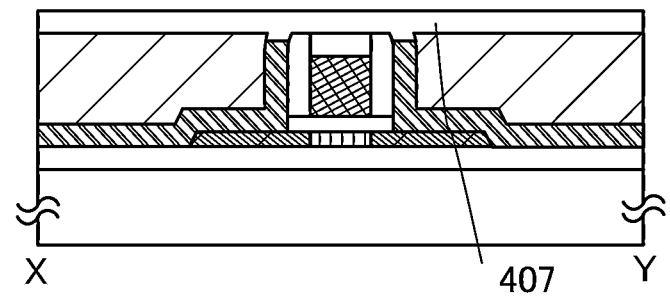

In this embodiment, the insulating film 407 is formed in contact with the insulating film 413, the source electrode layer 405a, the drain electrode layer 405b, the sidewall insulating layers 412a and 412b, and the interlayer insulating film 415 (see FIG. 3D).

Further, a highly-dense inorganic insulating film (typically an aluminum oxide film) which is to be a protective insulating film may be provided between the source electrode layer 405a and the interlayer insulating film 415 and between the drain electrode layer 405b and the interlayer insulating film 415.

Figure 4B:
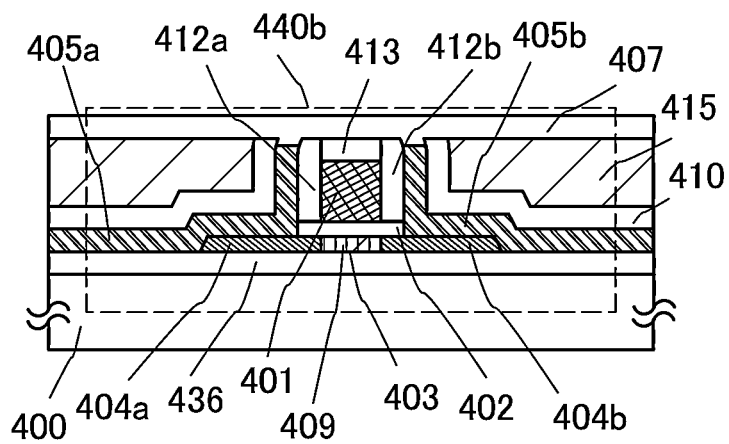
Figure 4C:
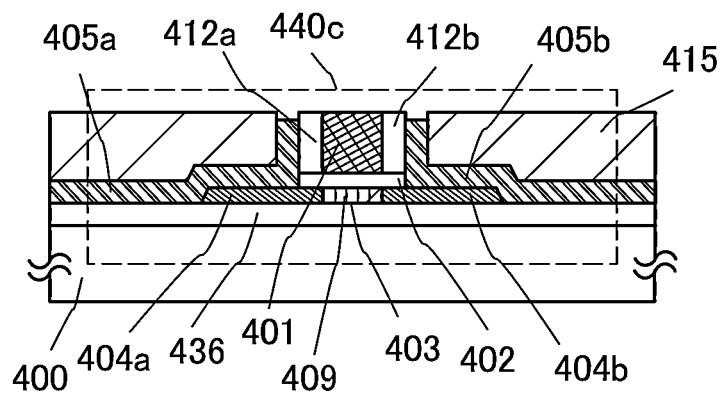

FIG. 4B illustrates an example of a transistor 440b in which an insulating film 410 is provided between the source electrode layer 405a and the interlayer insulating film 415 and between the drain electrode layer 405b and the interlayer insulating film 415. In the transistor 440b, a top surface of the insulating film 410 is also planarized by the cutting (grinding or polishing) step which is used in the formation process of the source electrode layer 405a and the drain electrode layer 405b.

The insulating films 407 and 410 may have either a single-layer structure or a stacked-layer structure, and preferably contain at least an aluminum oxide film.

The insulating films 407 and 410 can be formed by a plasma CVD method, a sputtering method, an evaporation method, or the like.

As the insulating films 407 and 410, an inorganic insulating film such as a silicon oxide film, a silicon oxynitride film, an aluminum oxynitride film, or a gallium oxide film can be typically used as well as the aluminum oxide film. Furthermore, as the insulating films 407 and 410, a hafnium oxide film, a magnesium oxide film, a zirconium oxide film, a lanthanum oxide film, a barium oxide film, or a metal nitride film (e.g., an aluminum nitride film) can be used.

In this embodiment, an aluminum oxide film is formed by a sputtering method as the insulating films 407 and 410. When the aluminum oxide film has high density (the film density is higher than or equal to 3.2 g/cm$^3$, preferably higher than or equal to 3.6 g/cm$^3$), the transistors 440a and 440b can have stable electric characteristics. The film density can be measured by Rutherford backscattering spectrometry (RBS) or X-ray reflectometry (XRR).

The aluminum oxide film which can be used as the insulating films 407 and 410 provided over the oxide semiconductor film 403 has a high blocking effect by which both oxygen and impurities such as hydrogen or moisture are prevented from passing through the film.

Therefore, in and after the manufacturing process, the aluminum oxide film functions as a protective film for preventing entry of impurities such as hydrogen or moisture, which causes change, into the oxide semiconductor film 403 and release of oxygen, which is a main constituent material of the oxide semiconductor, from the oxide semiconductor film 403.

The insulating films 407 and 410 are preferably formed using a method in which impurities such as water or hydrogen are prevented from entering the insulating films 407 and 410 (preferably a sputtering method or the like) as appropriate.

In order to remove residual moisture from the deposition chamber of the insulating films 407 and 410 in a manner similar to that of the formation of the oxide semiconductor film, an entrapment vacuum pump (such as a cryopump) is preferably used. When the insulating films 407 and 410 is formed in the deposition chamber evacuated using a cryopump, the impurity concentration of the insulating films 407 and 410 can be reduced. A turbo molecular pump provided with a cold trap may be used as an evacuation unit for removing moisture remaining in the deposition chamber used for forming the insulating films 407 and 410.

It is preferable that a high-purity gas in which impurities such as hydrogen, water, a hydroxyl group, or hydride are reduced be used as the sputtering gas for the formation of the insulating films 407 and 410.

Further, a planarization insulating film may be formed in order to reduce unevenness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Further, FIG. 4A illustrates an example in which openings reaching the source electrode layer 405a and the drain electrode layer 405b are formed in the interlayer insulating film 415 and the insulating film 407, and wiring layers 435a and 435b are formed in the openings. With the use of the wiring layers 435a and 435b, the transistor 440a is connected to another transistor or another element, which can lead to formation of a variety of circuits.

The wiring layers 435a and 435b can be formed using a material and a method similar to those of the gate electrode layer 401, the source electrode layer 405a, or the drain electrode layer 405b. For example, a metal film containing an element selected from Al, Cr, Cu, Ta, Ti, Mo, and W, a metal nitride film containing any of the above elements as a component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. The wiring layers 435a and 435b may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the wiring layers 435a and 435b, a single layer of molybdenum film, a stack of a tantalum nitride film and a copper film, or a stack of a tantalum nitride film and a tungsten film can be used.

As described above, in a semiconductor device, the transistors 440a, 440b, and 440c having a miniaturized structure with a small amount of variation in shapes or characteristics and high on-state characteristics can be provided with a high yield.

Accordingly, a miniaturized semiconductor device having high electric characteristics and a method for manufacturing the semiconductor device can be provided.

Embodiment 2

In this embodiment, an example of a semiconductor device which includes the transistor described in this specification, which can hold stored data even when not powered, and which has an unlimited number of write cycles is described with reference to drawings.

Figure 5A:
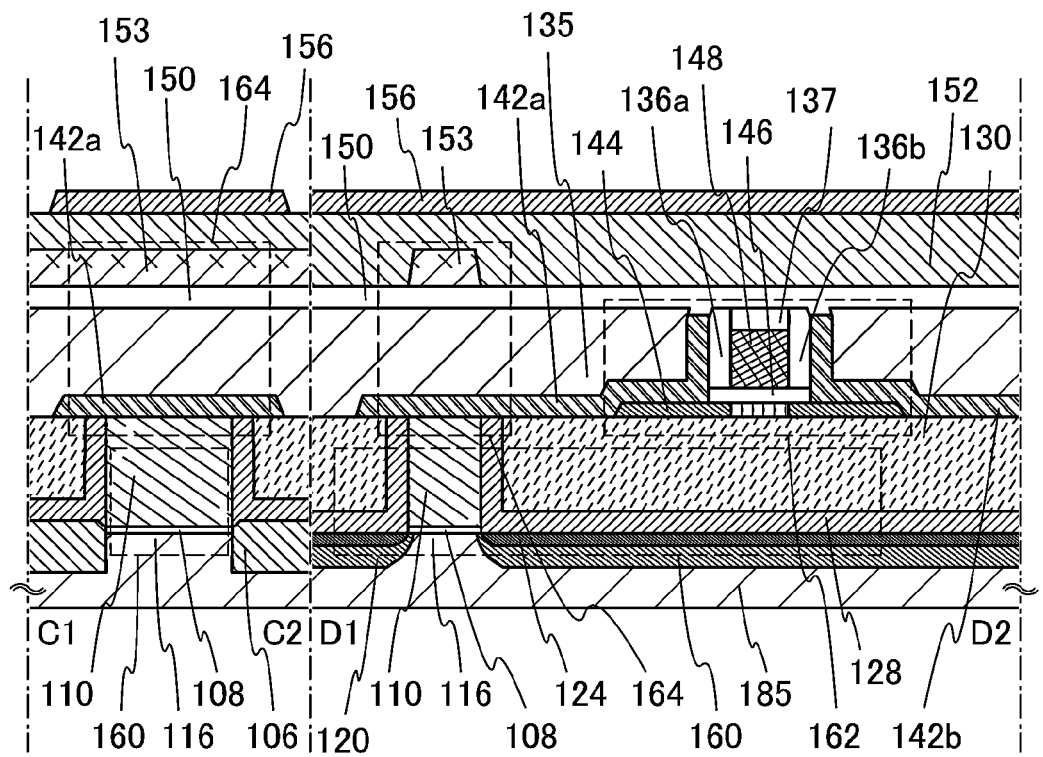
FIGS. 5A to 5C are a cross-sectional view, a plan view, and a circuit diagram illustrating an embodiment of a semiconductor device.
Figure 5B:
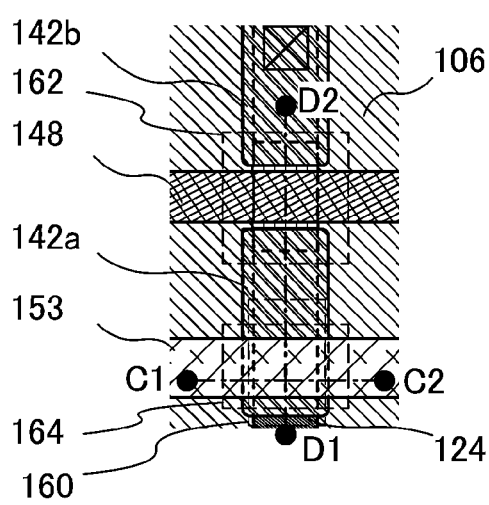
Figure 5C:
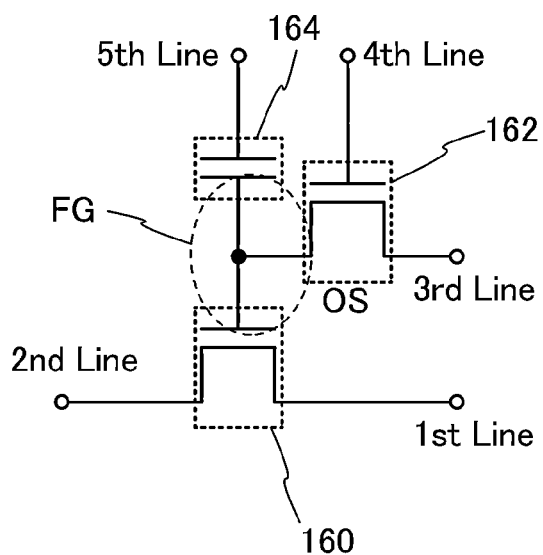

FIGS. 5A and 5B illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A to 5C includes a transistor 160 including a first semiconductor material in a lower portion, and a transistor 162 including a second semiconductor material in an upper portion. The transistor 162 is an example to which a structure of the transistor 440a described in Embodiment 1 is applied.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

Although all the transistors are n-channel transistors here, it is needless to say that p-channel transistors can be used. It is not necessary to limit a specific structure of the semiconductor device, such as a material of the semiconductor device or a structure of the semiconductor device, to the structure described here such as the transistor 162 using an oxide semiconductor used for holding data, which is described in Embodiment 1.

The transistor 160 in FIG. 5A includes a channel formation region 116 provided in a substrate 185 containing a semiconductor material (e.g., silicon), impurity regions 120 provided so that the channel formation region 116 is sandwiched therebetween, metal compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, an element isolation insulating layer 106 is formed over the substrate 185 to surround the transistor 160, and an insulating layer 128 and an insulating layer 130 are formed to cover the transistor 160. Note that, in the transistor 160, the sidewall insulating layers may be formed on side surfaces of the gate electrode 110 and the impurity regions 120 may include a region having a different impurity concentration.

The transistor 160 formed using a single crystal semiconductor substrate can operate at high speed. Thus, when the transistor is used as a reading transistor, data can be read at a high speed. Two insulating films are formed to cover the transistor 160. As treatment prior to formation of the transistor 162 and a capacitor 164, CMP treatment is performed on the two insulating films, whereby an insulating layer 128 and an insulating layer 130 which are planarized are formed and, at the same time, a top surface of the gate electrode 110 is exposed.

As each of the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as a polyimide resin, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide film is used as the insulating layer 130.

Planarization treatment is preferably performed on the surface of the insulating layer 130 in the formation region of the oxide semiconductor film 144. In this embodiment, the oxide semiconductor film 144 is formed over the insulating layer 130 sufficiently planarized by polishing treatment such as CMP treatment (the average surface roughness of the surface of the insulating layer 130 is preferably less than or equal to 0.15 nm).

The transistor 162 illustrated in FIG. 5A includes an oxide semiconductor in the channel formation region. Here, an oxide semiconductor film 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

In the process for manufacturing the transistor 162, a conductive film over a gate electrode 148, an insulating film 137, and sidewall insulating layers 136a and 136b is removed by chemical mechanical polishing treatment to form electrode layers 142a and 142b functioning as a source electrode layer and a drain electrode layer.

Accordingly, in the transistor 162, the distance between the gate electrode 148 and a region (contact region) in which the oxide semiconductor film 144 is in contact with the electrode layer 142a or the electrode layer 142b which functions as a source or drain electrode layer can be made short, so that the resistance between the gate electrode 148 and the region (contact region) in which the oxide semiconductor film 144 is in contact with the electrode layer 142a or the electrode layer 142b is reduced; thus, the on-state characteristics of the transistor 162 can be improved.

Further, precise processing can be performed accurately because an etching step using a resist mask is not performed in a step for removing the conductive film over the gate electrode 148, which is one step of the formation process of the electrode layers 142a and 142b. Consequently, in a process for manufacturing the semiconductor device, a transistor having a miniaturized structure with less variation in shape or characteristics can be manufactured with high yield.

An interlayer insulating film 135 and an insulating film 150 each of which has a single-layer structure or a stacked-layer structure are provided over the transistor 162. In this embodiment, an aluminum oxide film is used as the insulating film 150. When the aluminum oxide film has high density (the film density is higher than or equal to 3.2 g/cm$^3$, preferably higher than or equal to 3.6 g/cm$^3$), the transistor 162 can have stable electric characteristics.

In addition, a conductive layer 153 is provided in a region overlapping with the electrode layer 142a of the transistor 162 with the interlayer insulating film 135 and the insulating film 150 interposed therebetween, and the electrode layer 142a, the interlayer insulating film 135, the insulating film 150, and the conductive layer 153 form a capacitor 164. That is, the source electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

An insulating layer 152 is provided over the transistor 162 and the capacitor 164. In addition, a wiring 156 for connecting the transistor 162 to another transistor is provided over the insulating layer 152. Although not illustrated in FIG. 5A, the wiring 156 is electrically connected to the electrode layer 142b through an electrode formed in an opening provided in the insulating film 150, the insulating layer 152, a gate insulating film 146, and the like. Here, the electrode is preferably provided to partly overlap with at least part of the oxide semiconductor film 144 of the transistor 162.

In FIGS. 5A and 5B, the transistor 160 is provided to overlap with at least part of the transistor 162. The source region or the drain region of the transistor 160 is preferably provided to overlap with part of the oxide semiconductor film 144. Further, the transistor 162 and the capacitor 164 are provided to overlap with at least part of the transistor 160. For example, the conductive layer 153 of the capacitor 164 is provided to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by contacting the electrode layer 142b with the wiring 156 directly or may be established through an electrode provided in an insulating layer which is between the electrode layer 142b and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first line (1st Line) is electrically connected to a source electrode of the transistor 160. A second line (2nd Line) is electrically connected to a drain electrode of the transistor 160. A third line (a 3rd line) and one of source or drain electrodes of the transistor 162 are electrically connected to each other, and a fourth line (a 4th line) and a gate electrode of the transistor 162 are electrically connected to each other. A gate electrode of the transistor 160 and the other of the source electrode and the drain electrode of the transistor 162 are electrically connected to one electrode of a capacitor 164, and a fifth line (a 5th line) and the other electrode of the capacitor 164 are electrically connected to each other.

The semiconductor device in FIG. 5C utilizes a characteristic in which the potential of the gate electrode of the transistor 160 can be held, and thus enables data writing, holding, and reading as follows.

Writing and holding of data are described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as low level charge and high level charge) is given. After that, the potential of the fourth line is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where a high level charge is given to the gate electrode of the transistor 160 is lower than an apparent threshold voltage $V_{th\_L}$ in the case where a low level charge is given to the gate electrode of the transistor 160. Here, an apparent threshold voltage refers to the potential of the fifth line, which is needed to turn on the transistor 160. Thus, the potential of the fifth line is set to a potential $V_0$ which is between $V_{th\_H}$ and $V_{th\_L}$, whereby charge given to the gate electrode of the transistor 160 can be determined. For example, in the case where a high level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case of a memory cell in which reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$ may be applied to the fifth lines.

Figure 19A:
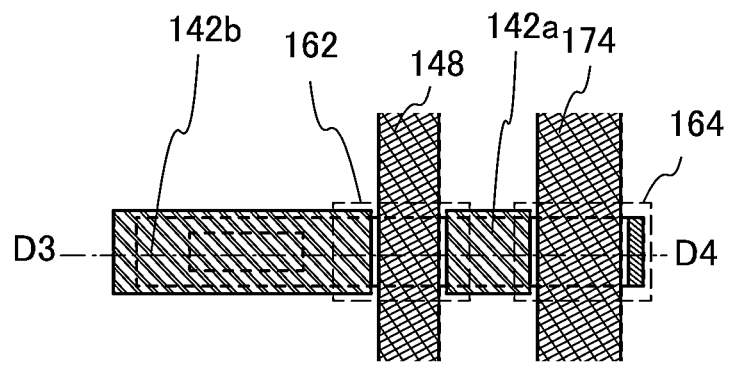
FIGS. 19A and 19B are a plan view and a cross-sectional view illustrating an embodiment of a semiconductor device.
Figure 19B:
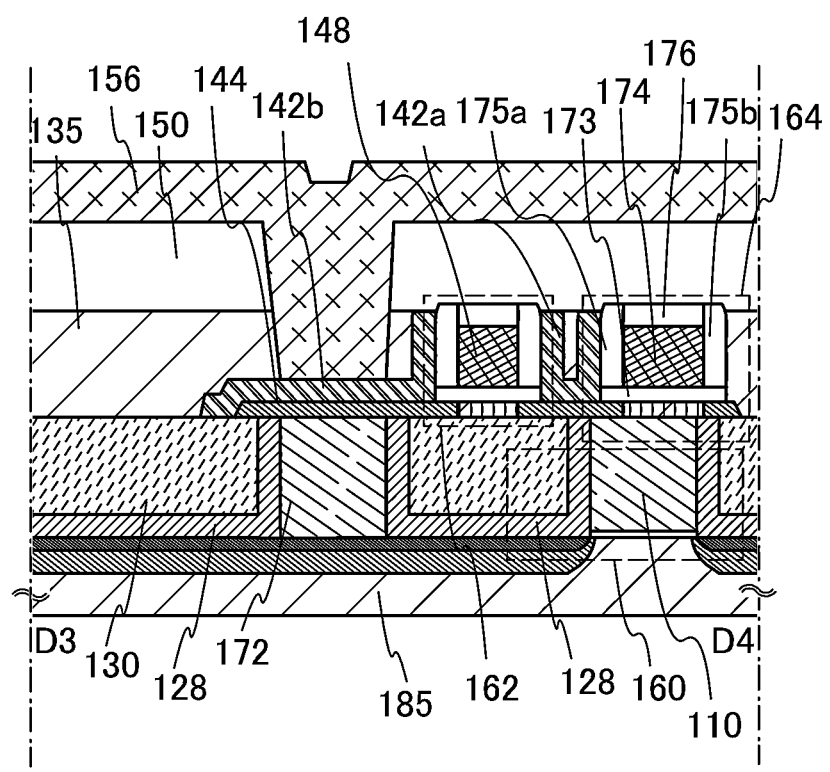

FIGS. 19A and 19B illustrate another example of the semiconductor device. FIG. 19A and FIG. 19B are a plan view and a cross-sectional view of the semiconductor device, respectively. Here, FIG. 19B corresponds to the cross section along line D3-D4 in FIG. 19A. Note that in FIG. 19A, some components of the semiconductor device illustrated in FIG. 19B are omitted for clarity.

In FIGS. 19A and 19B, the capacitor 164 includes the gate electrode 110, the oxide semiconductor film 144, an insulating film 173, and a conductive layer 174. The conductive layer 174 is formed by the same steps as the gate electrode 148, and a top surface of the conductive layer 174 is covered with an insulating film 176, and side surfaces of the conductive layer 174 are covered with sidewall insulating layers 175a and 175b.

The electrode layer 142b of the transistor 162 is electrically connected to the wiring 156 in an opening which is formed in the interlayer insulating film 135 and the insulating film 150 and reaches the electrode layer 142b. Further, a conductive layer 172 is provided below and in contact with the oxide semiconductor film 144, and electrically connects the transistor 160 to the transistor 162.

As illustrated in FIGS. 19A and 19B, the transistor 160, the transistor 162, and the capacitor 164 are closely stacked to overlap with each other, whereby the area occupied by the semiconductor device can be decreased; thus, the semiconductor device can be highly integrated.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to an embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The structures and methods described in this embodiment can be combined as appropriate with any of the described in the other embodiments.

Embodiment 3

In this embodiment, a semiconductor device which includes the transistor described in Embodiment 1 or 2, which can hold stored data even when not powered, and which does not have a limitation on the number of write cycles, and which has a structure different from the structure described in Embodiment 2 is described with reference to FIGS. 6A and 6B and FIGS. 7A and 7B.

Figure 6A:
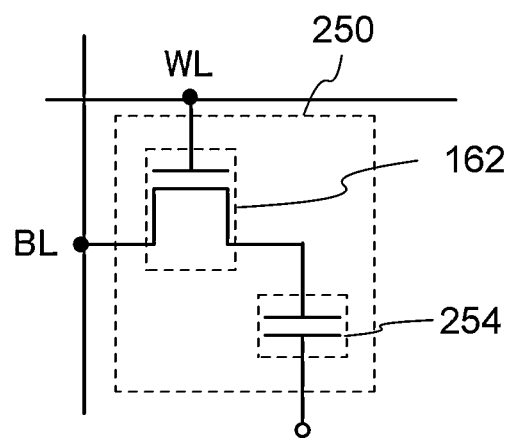
FIGS. 6A and 6B are a circuit diagram and a perspective view illustrating an embodiment of a semiconductor device.
Figure 6B:
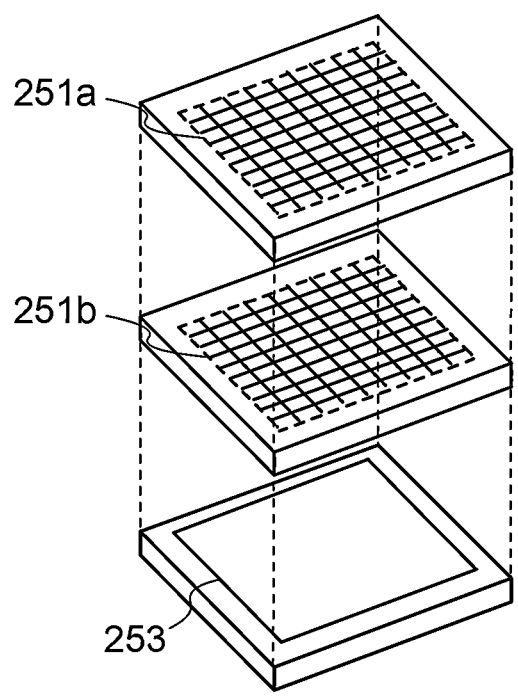

FIG. 6A illustrates an example of a circuit configuration of a semiconductor device, and FIG. 6B is a conceptual diagram illustrating an example of a semiconductor device. First, the semiconductor device illustrated in FIG. 6A is described, and then, the semiconductor device illustrated in FIG. 6B is described below.

In the semiconductor device illustrated in FIG. 6A, a bit line BL is electrically connected to one of the source electrode and the drain electrode of the transistor 162, a word line WL is electrically connected to the gate electrode of the transistor 162, and the other of the source electrode and the drain electrode of the transistor 162 is electrically connected to a first terminal of a capacitor 254.

Next, writing and holding of data in the semiconductor device (a memory cell 250) illustrated in FIG. 6A are described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

The transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Secondly, reading of data is described. When the transistor 162 is turned on, the bit line BL and the first terminal of the capacitor 254 which are in a floating state are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 6B is described.

The semiconductor device illustrated in FIG. 6B includes memory cell arrays 251a and 251b including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which two memory cell arrays 251 (the memory cell array 251a and the memory cell array 251b) are stacked; however, the number of memory cell arrays to be stacked is not limited thereto. Three or more memory cell arrays may be stacked.

Next, a specific structure of the memory cell 250 illustrated in FIG. 6A is described with reference to FIGS. 7A and 7B.

Figure 7A:
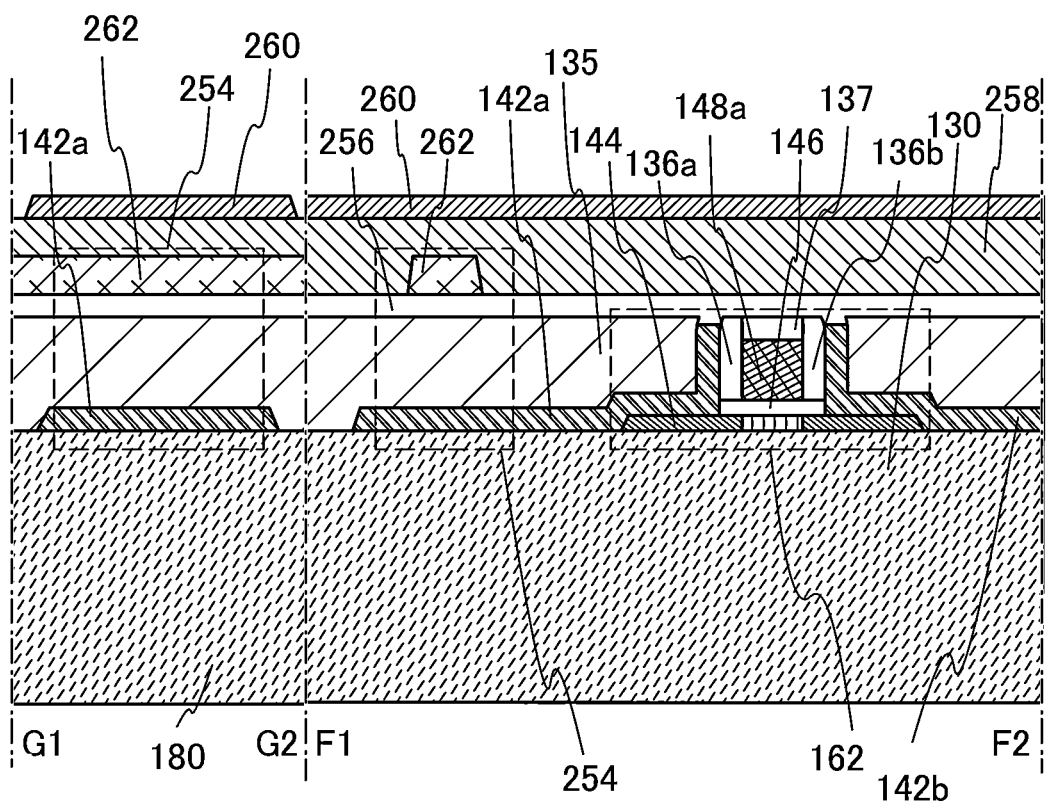
FIGS. 7A and 7B are a cross-sectional view and a plan view illustrating an embodiment of a semiconductor device.
Figure 7B:
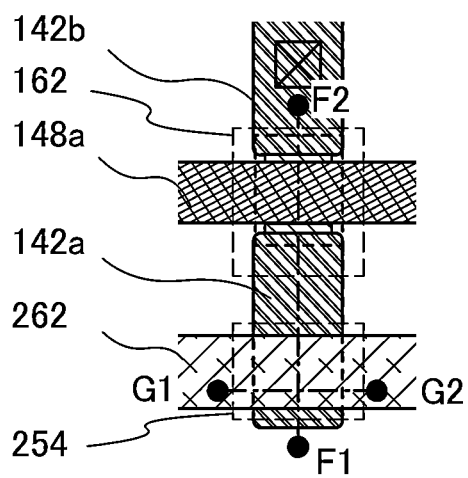

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 in FIGS. 7A and 7B can have the same structure as the transistor in Embodiment 1 or 2.

An insulating layer 256 having a single-layer structure or a stacked-layer structure is provided over the transistor 162 over which an insulating layer 180 is provided. In addition, a conductive layer 262 is provided in a region overlapping with the electrode layer 142a of the transistor 162 with the insulating layer 256 interposed therebetween, and the electrode layer 142a, the interlayer insulating film 135, the insulating layer 256, and the conductive layer 262 form a capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Further, the memory cell 250 and a wiring 260 for connecting the adjacent memory cells 250 are provided over the insulating film 258. Although not illustrated, the wiring 260 is electrically connected to the electrode layer 142b of the transistor 162 through an opening provided in the insulating layer 256, the insulating film 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell. With such a planar layout, the area occupied by the semiconductor device can be reduced; thus, higher integration can be achieved.

When the planar layout illustrated in FIG. 7A is employed, the area occupied by the semiconductor device can be reduced; thus, the degree of integration can be increased.

Figure 20A:
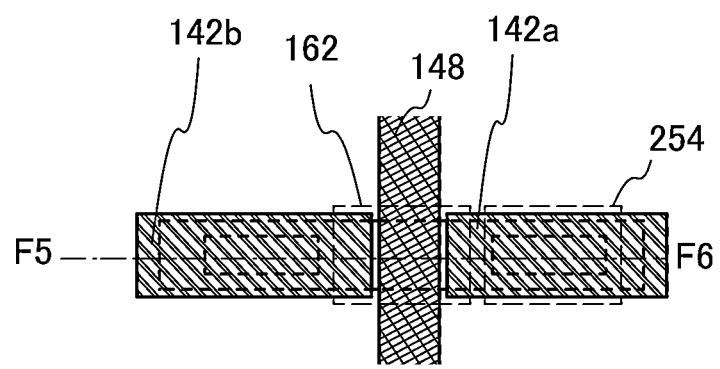
FIGS. 20A and 20B are a plan view and a cross-sectional view illustrating an embodiment of a semiconductor device.
Figure 20B:
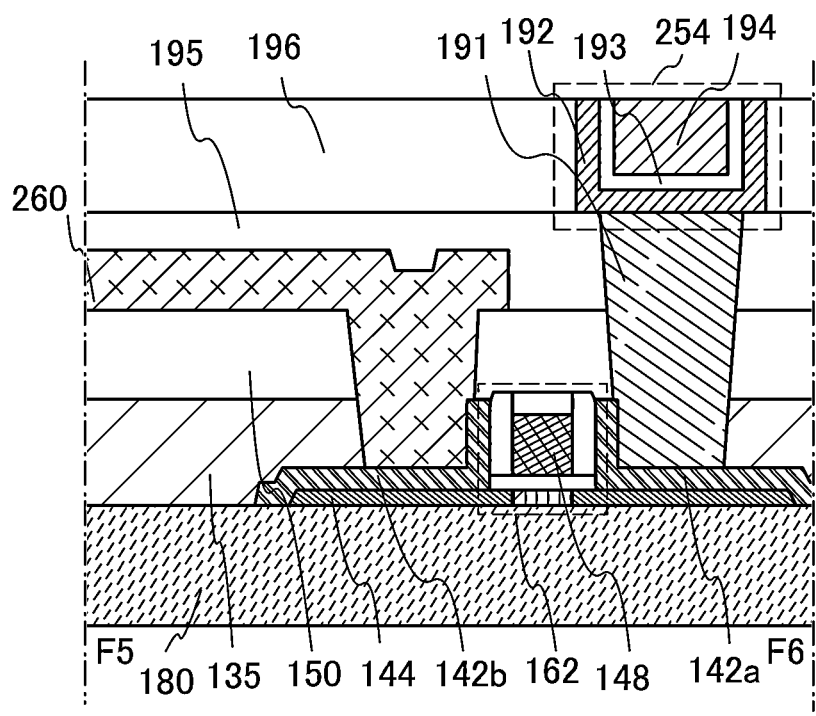

FIGS. 20A and 20B illustrate another example of the semiconductor device.

FIGS. 20A and 20B are a plan view and a cross-sectional view of the semiconductor device, respectively. Here, FIG. 20B corresponds to a cross section taken along line F5-F6 of FIG. 20A. Note that in FIG. 20A, some of components of the semiconductor device illustrated in FIG. 20B are omitted for clarity.

In FIGS. 20A and 20B, the capacitor 254 includes a conductive layer 192, an insulating film 193, and a conductive layer 194, and is formed in an insulating film 196. Note that an insulating material having high dielectric constant is preferably used for the insulating film 193. The capacitor 254 and the transistor 162 are electrically connected to each other through a conductive layer 191 provided in the opening which is formed in the interlayer insulating film 135, the insulating film 150, and an insulating film 195 and reaches the electrode layer 142a of the transistor 162.

As illustrated in FIGS. 20A and 20B, the transistor 162 and the capacitor 254 are closely stacked to overlap with each other, whereby the occupied area of the semiconductor device can be decreased; thus, the semiconductor device can be highly integrated.

As described above, the plurality of memory cells is formed in the upper portion with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with the structures described in the other embodiments.

Embodiment 4

In this embodiment, examples of application of the semiconductor device described in any of the above embodiments to portable devices such as cellular phones, smartphones, or electronic books are described with reference to FIGS. 8A and 8B, FIG. 9, FIG. 10, and FIG. 11.

In a portable device such as a cellular phone, a smartphone, or an electronic book, an SRAM or a DRAM is used to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 8A:
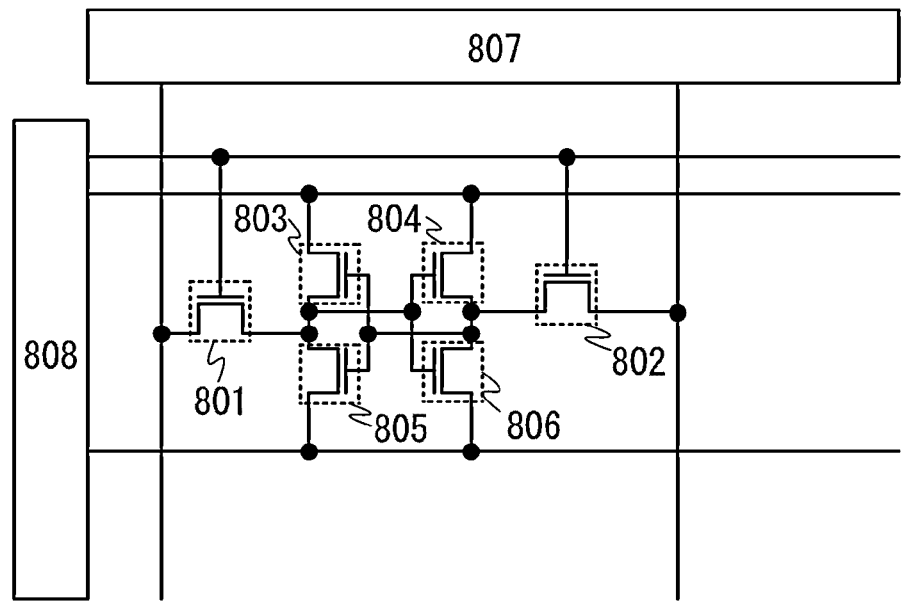
FIGS. 8A and 8B are circuit diagrams each illustrating an embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 8B:
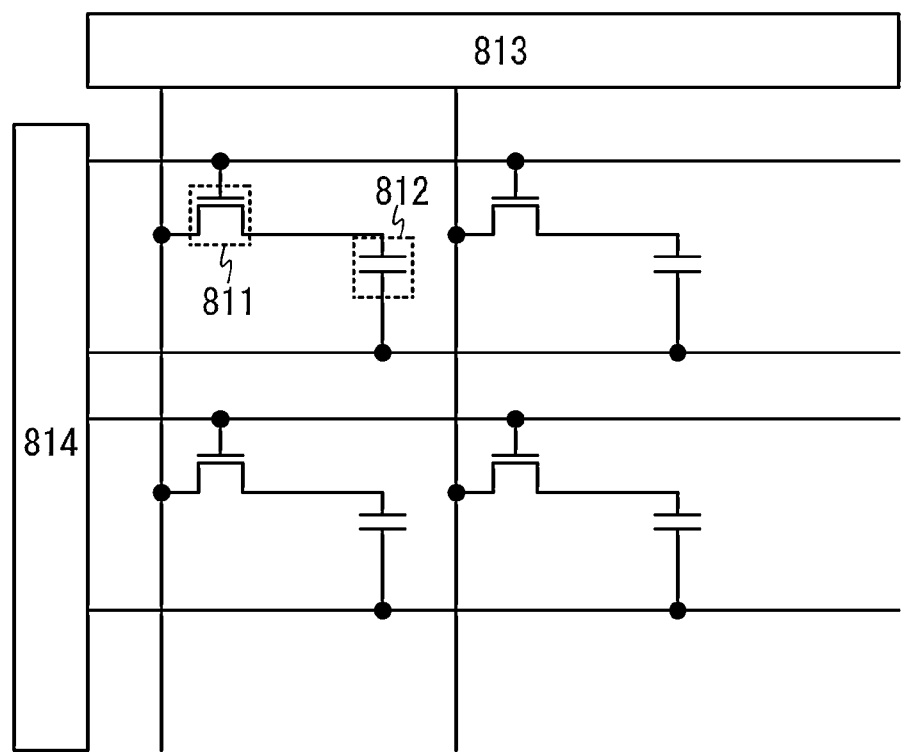

In a DRAM, as illustrated in FIG. 8B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 9:
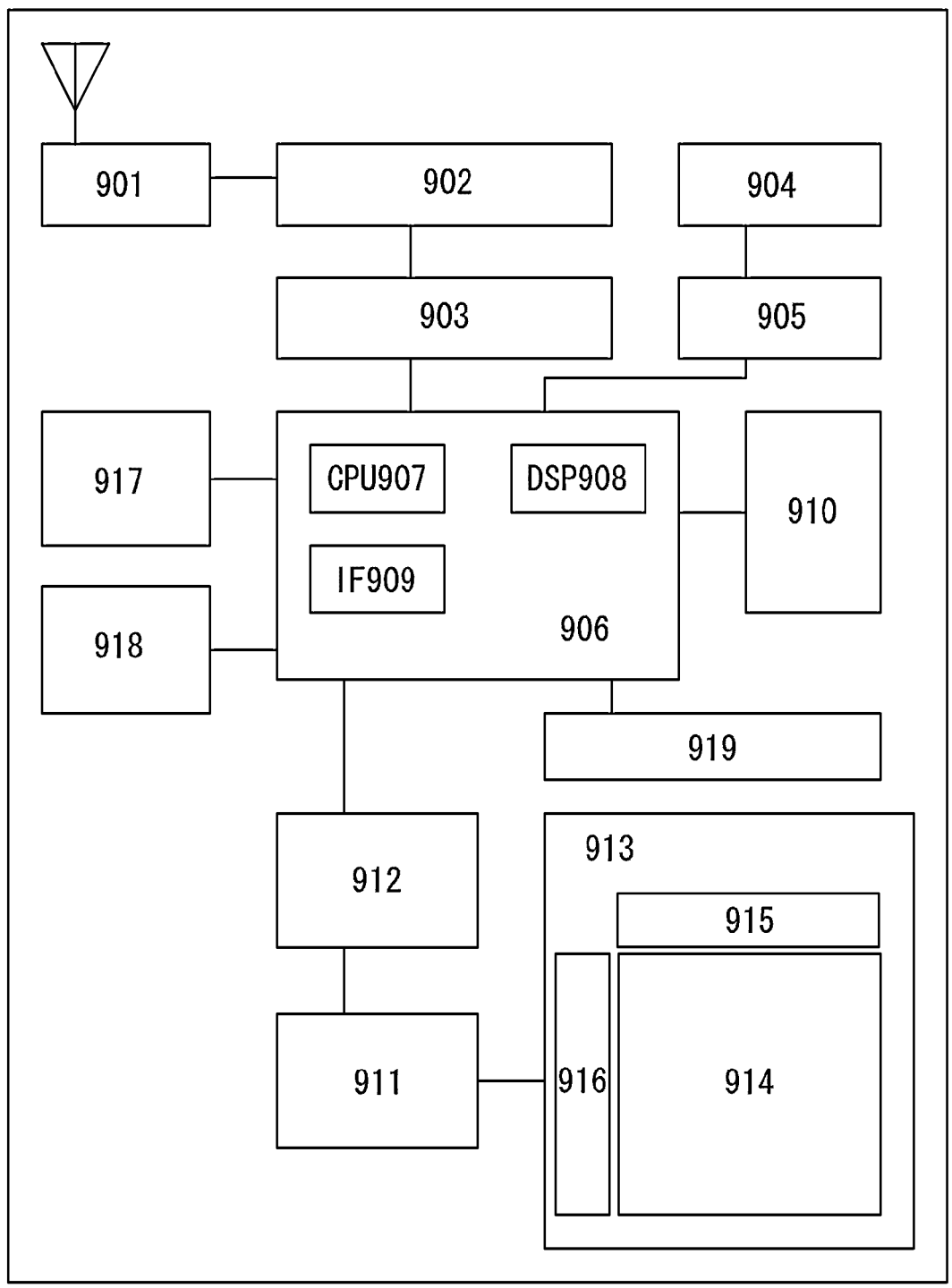
FIG. 9 is a block diagram illustrating an embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 10:
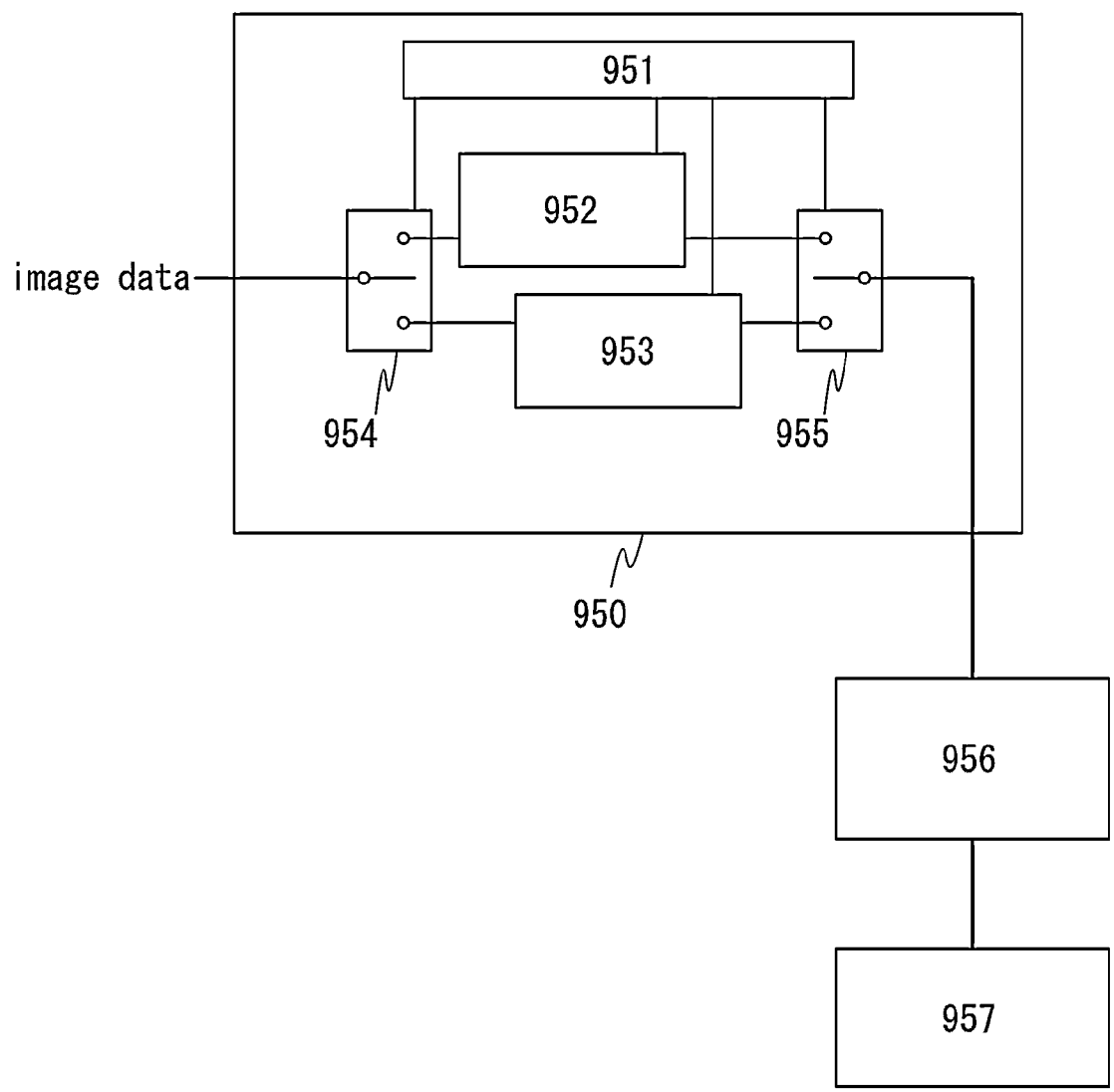
FIG. 10 is a block diagram illustrating an embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and is displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
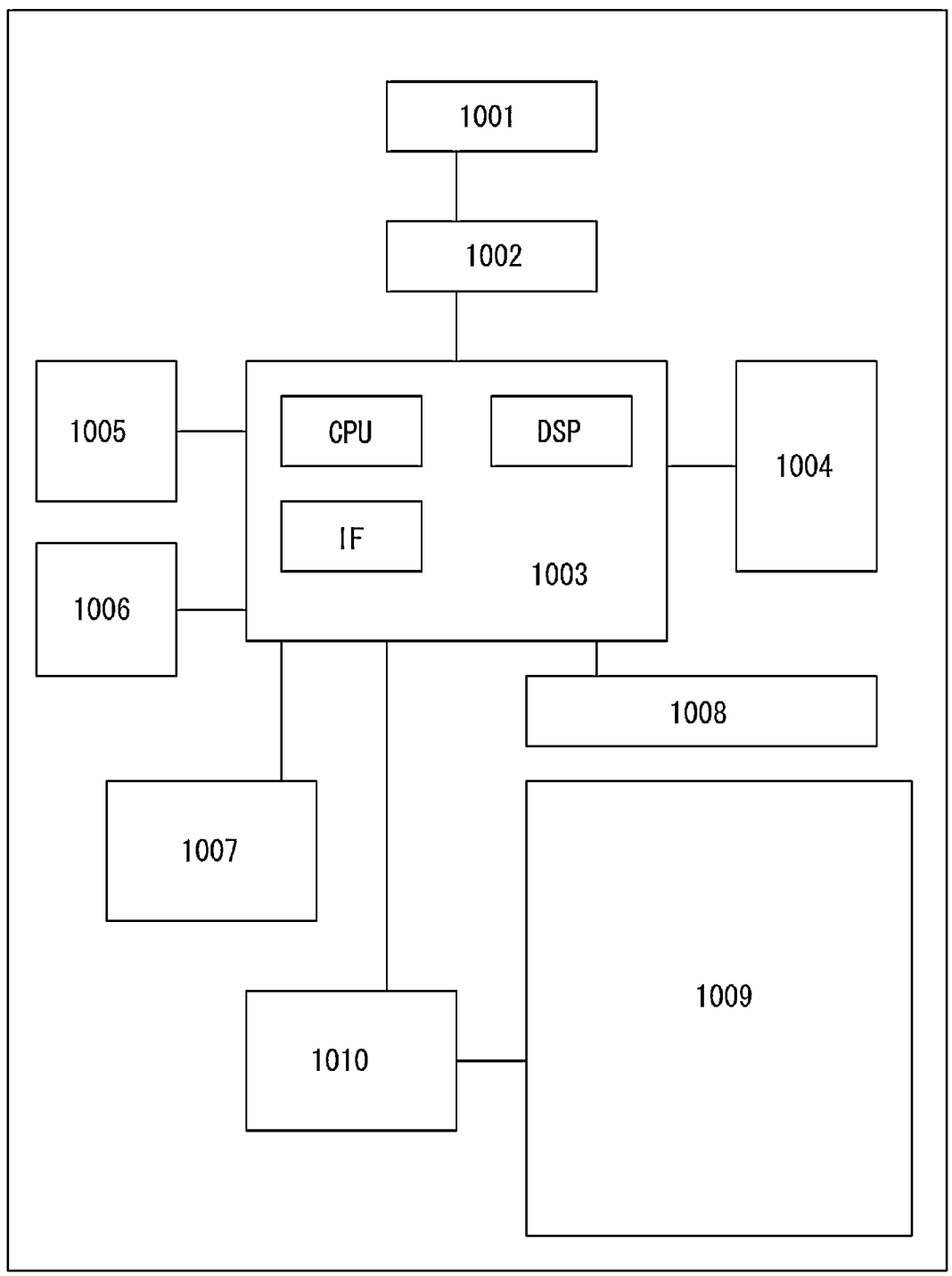
FIG. 11 is a block diagram illustrating an embodiment of a semiconductor device.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, a user may use a highlight function. In some cases, a user wants to mark a specific portion while reading an e-book reader. This marking function is called a highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Also in such a case, the semiconductor device described in any of the above embodiments is used, whereby writing and reading of data can be performed at high speed, data can be stored for a long time, and power consumption can be sufficiently reduced.

As described above, the portable devices described in this embodiment each incorporate the semiconductor device according to any of the above embodiments. Therefore, it is possible to obtain a portable device which is capable of reading data at high speed, holding data for a long time, and reducing power consumption.

The configurations, methods, and the like described in this embodiment can be combined as appropriate with any of the configurations, methods, and the like described in the other embodiments.

Embodiment 5

A semiconductor device (also referred to as a display device) having a display function can be manufactured using the transistor an example of which is described in the above embodiments. Moreover, part or all of the driver circuitry which includes the transistor can be formed over a substrate where a pixel portion is formed, whereby a system-on-panel can be formed.

Figure 12A:
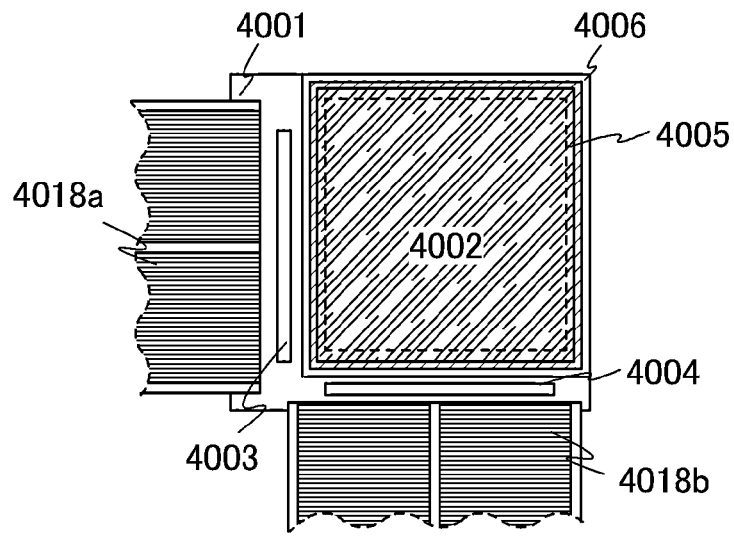
FIGS. 12A to 12C are plan views each illustrating an embodiment of a semiconductor device.

In FIG. 12A, a sealant 4005 is provided to surround a pixel portion 4002 provided over a first substrate 4001, and the pixel portion 4002 is sealed with a second substrate 4006. In FIG. 12A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018a and 4018b.

Figure 12B:
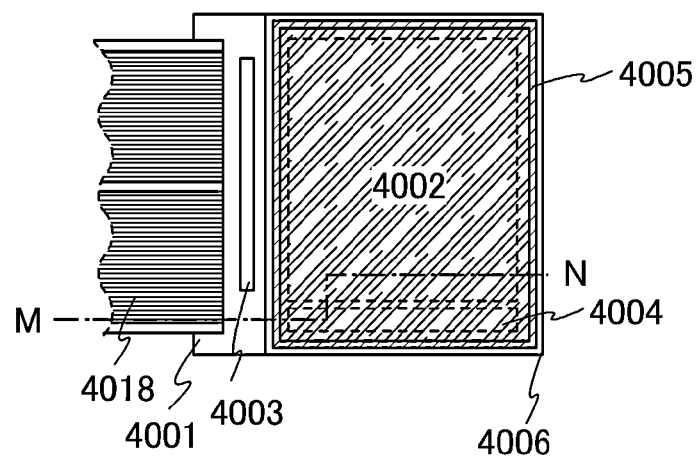
Figure 12C:
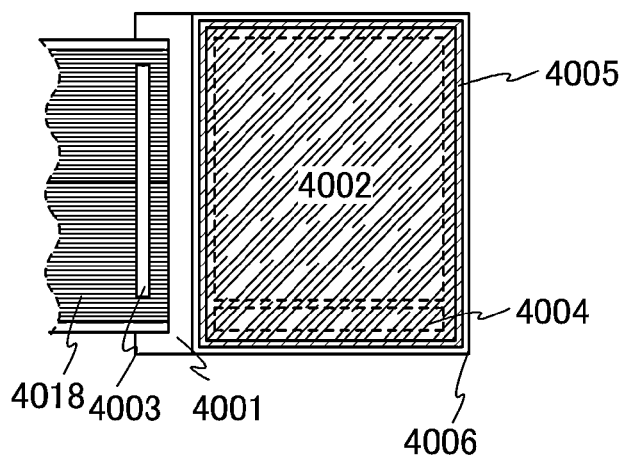

In FIGS. 12B and 12C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 12B and 12C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 12B and 12C, a variety of signals and potentials are supplied to the signal line driver circuit 4003, the scan line driver circuit 4004, and the pixel portion 4002 from an FPC 4018.

Although FIGS. 12B and 12C each illustrate an example in which the signal line driver circuit 4003 is formed separately and mounted over the first substrate 4001, embodiments of the present invention are not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 12A illustrates an example in which the signal line driver circuit 4003 and the scan line driver circuit 4004 are mounted by a COG method; FIG. 12B illustrates an example in which the signal line driver circuit 4003 is mounted by a COG method; and FIG. 12C illustrates an example in which the signal line driver circuit 4003 is mounted by a TAB method.

In addition, the display device includes in its category a panel (a display panel or a light-emitting panel) in which a display element is sealed, and a module in which an IC and the like including a controller are mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

An embodiment of a semiconductor device is described with reference to FIGS. 12A to 12C and FIGS. 13A and 13B. FIGS. 13A and 13B are cross-sectional diagrams taken along line M-N of FIG. 12B.

As illustrated in FIGS. 12A to 12C and FIGS. 13A and 13B, the semiconductor device includes a connection terminal electrode layer 4015 and a terminal electrode layer 4016, and the connection terminal electrode layer 4015 and the terminal electrode layer 4016 are electrically connected to a terminal included in the FPC 4018 through an anisotropic conductive film 4019.

The connection terminal electrode layer 4015 is formed using the same conductive film as a first electrode layer 4030, and the terminal electrode layer 4016 is formed using the same conductive film as source and drain electrode layers of transistors 4010 and 4011.

Each of the pixel portion 4002 and the scan line driver circuit 4004 which are provided over the first substrate 4001 includes a plurality of transistors. In FIGS. 12A to 12C and FIGS. 13A and 13B, the transistor 4010 included in the pixel portion 4002 and the transistor 4011 included in the scan line driver circuit 4004 are illustrated as an example. An interlayer insulating film 4020 and an insulating film 4024 are provided over the transistors 4010 and 4011 in FIG. 13A, and an insulating film 4021 is further provided in FIG. 13A. An insulating film 4023 is an insulating film serving as a base film. A light-blocking film 4050 is provided to overlap with the transistors 4010 and 4011.

Any of the transistors described in the above embodiments can be applied to the transistors 4010 and 4011. In this embodiment, an example in which a transistor having a structure similar to that of the transistor 440a described in Embodiment 1 is used is described.

In the manufacturing process of the transistors 4010 and 4011, a conductive film provided over a gate electrode layer, an insulating film, and sidewall insulating layers is removed by chemical mechanical polishing treatment, so that the conductive film is divided; thus, a source electrode layer and a drain electrode layer are formed.

Accordingly, the distance between the gate electrode layer and a region (contact region) in which an oxide semiconductor film is in contact with the source electrode layer or the drain electrode layer can be made short, so that the resistance between the gate electrode layer and the region (contact region) in which the oxide semiconductor film is in contact with the source electrode layer or the drain electrode layer is reduced; thus, the on-state characteristics of the transistors 4010 and 4011 can be improved.

Precise processing can be performed accurately because an etching step using a resist mask is not performed in a step for removing the conductive film over the gate electrode layer, which is one step of the formation process of the source electrode layer and the drain electrode layer. Consequently, in a process for manufacturing the semiconductor device, the transistors 4010 and 4011 each having a miniaturized structure with less variation in shape or characteristics can be manufactured with high yield.

Accordingly, a highly reliable semiconductor device can be provided as the semiconductor device of this embodiment illustrated in FIGS. 12A to 12C and FIGS. 13A and 13B.

Further, a conductive layer may be further provided to overlap with a channel formation region of the oxide semiconductor film in the transistor 4011 for the driver circuit. By providing the conductive layer to overlap with the channel formation region in the oxide semiconductor film, the amount of change in the threshold voltage of the transistor 4011 by a bias-temperature stress test (BT test) can be further reduced. The conductive layer may have the same potential as or a potential different from that of a gate electrode layer of the transistor 4011, and can function as a second gate electrode layer. The potential of the conductive layer may be GND, 0V, or in a floating state.

The conductive layer also has a function of blocking an external electric field, that is, to prevent an external electric field (particularly, to prevent static electricity) from effecting the inside (a circuit portion including a transistor). A blocking function of the conductive layer can prevent the variation in electrical characteristics of the transistor due to the effect of external electric field such as static electricity.

The transistor 4010 included in the pixel portion 4002 is electrically connected to a display element to constitute a part of a display panel. There is no particular limitation on the kind of the display element as long as display can be performed, and various kinds of display elements can be used.

An example of a liquid crystal display device using a liquid crystal element as a display element is illustrated in FIG. 13A. In FIG. 13A, a liquid crystal element 4013 which is a display element includes a first electrode layer 4030, a second electrode layer 4031, and a liquid crystal layer 4008. Insulating films 4032 and 4033 serving as orientation films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. In that case, the liquid crystal layer 4008 is in contact with the first electrode layer 4030 and the second electrode layer 4031. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not requisite and the viewing angle dependence is small. In addition, since an alignment film does not need to be provided and thus rubbing treatment is not requisite, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor using an oxide semiconductor film.

The specific resistivity of the liquid crystal material is greater than or equal to $1 \times 10^9$ $\Omega \cdot cm$, preferably greater than or equal to $1 \times 10^{11}$ $\Omega \cdot cm$, further preferably greater than or equal to $1 \times 10^{12}$ $\Omega \cdot cm$. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like.

In the transistor using an oxide semiconductor film used in this embodiment, the current in an off state (off-state current) can be suppressed to be small. Accordingly, an electric signal such as an image signal can be held for a longer period, and a writing interval can be set longer in an on state. The frequency of refresh operation can be accordingly reduced, which leads to an effect of suppressing power consumption.

Further, the transistor using an oxide semiconductor film used in this embodiment can exhibit relatively high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Embodiments of the disclosed invention are not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. This light-emitting element is called a current-excitation light-emitting element after such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side; a light-emitting element having any of these emission structures can be used.

An example of a light-emitting device (light-emitting panel) in which a light-emitting element is used as a display element is illustrated in FIG. 13B. A light-emitting element 4513 which is the display element is electrically connected to the transistor 4010 provided in the pixel portion 4002. A structure of the light-emitting element 4513 is not limited to the shown stacked-layer structure, which is the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is preferable that the partition wall 4510 be formed using a photosensitive resin material and have an opening over the first electrode layer 4030 so that a sidewall of the opening is formed as a tilted surface with continuous curvature.

The electroluminescent layer 4511 has either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 12A to 12C and FIGS. 13A and 13B, a flexible substrate as well as a glass substrate can be used as any of the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

An oxide insulating film can be used for the interlayer insulating film 4020 and the insulating film 4024. The interlayer insulating film 4020 and the insulating film 4024 can be formed by a plasma CVD method, a sputtering method, or the like using any of silicon oxide, silicon oxynitride, aluminum oxide, aluminum oxynitride, hafnium oxide, and gallium oxide, or a mixed material thereof. Further, a nitride insulating film may be stacked over the oxide insulating film, and the nitride insulating film can be formed using any of silicon nitride, silicon nitride oxide, aluminum nitride, and aluminum nitride oxide, or a mixed material thereof.

In this embodiment, an aluminum oxide film is used as the insulating film 4024. The insulating film 4024 can be formed by a sputtering method or a plasma CVD method.

The aluminum oxide film which is provided as the insulating film 4024 over the oxide semiconductor film has a high blocking effect by which both oxygen and impurities such as hydrogen or moisture are prevented from passing through the film.

Therefore, in and after the manufacturing process, the aluminum oxide film functions as a protective film for preventing entry of impurities such as hydrogen or moisture, which causes change, into the oxide semiconductor film and release of oxygen, which is a main constituent material of the oxide semiconductor, from the oxide semiconductor film.

The insulating film 4021 serving as a planarization insulating film can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

Any of the transistors described in any of the above embodiments as described above enables semiconductor devices having a variety of functions to be provided.

This embodiment can be implemented in appropriate combination with the structures described in the other embodiments.

Embodiment 6

Any of the transistors described in Embodiment 1 enables a semiconductor device having an image sensor function of reading data on an object to be manufactured.

Figure 14A:
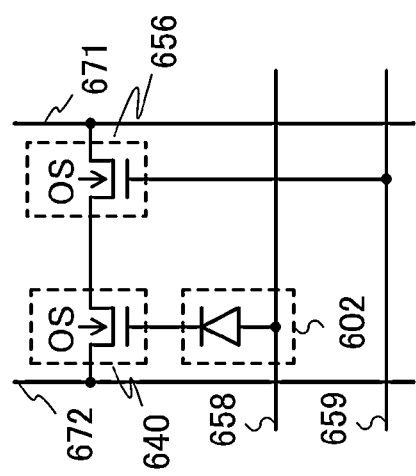
FIGS. 14A and 14B are a circuit diagram and a cross-sectional view illustrating an embodiment of a semiconductor device.

FIG. 14A illustrates an example of a semiconductor device having an image sensor function. FIG. 14A is an equivalent circuit diagram of a photosensor, and FIG. 14B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor including an oxide semiconductor film is denoted by a symbol "OS" so that it can be identified as a transistor including an oxide semiconductor film. In FIG. 14A, the transistor 640 and the transistor 656 are transistors each using an oxide semiconductor film, to which any of the transistors described in any of the above embodiments can be applied. Described in this embodiment is an example in which a transistor having a structure similar to that of the transistor 440a described in Embodiment 1 is used.

Figure 14B:
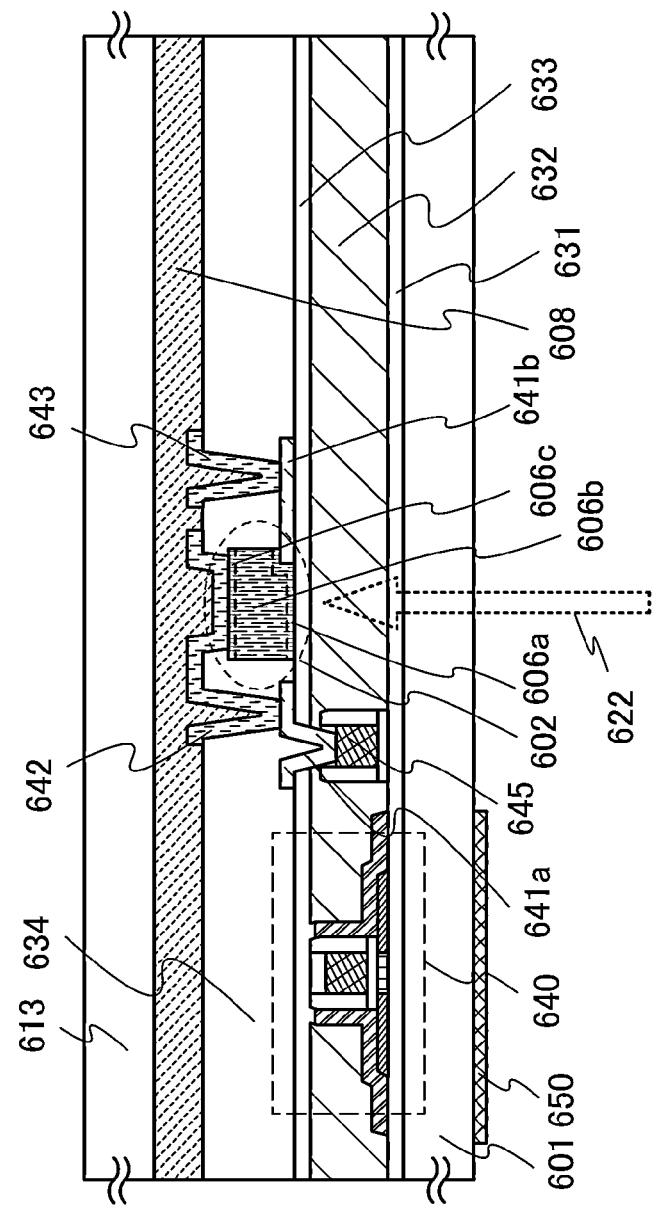

FIG. 14B is a cross-sectional diagram of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An interlayer insulating film 632, an insulating film 633, and an interlayer insulating film 634 are provided over the transistor 640 provided over the insulating film 631. The photodiode 602 is provided over the insulating film 633. In the photodiode 602, a first semiconductor film 606a, a second semiconductor film 606b, and a third semiconductor film 606c are sequentially stacked from the insulating film 633 side, between an electrode layer 642 formed over the interlayer insulating film 634 and electrode layers 641a and 641b which are formed over the insulating film 633.

Note that a light-blocking film 650 is provided in a region which overlaps with the transistor 640.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced to the amorphous silicon film by a diffusion method or an ion implantation method. Heating or the like may be performed after the impurity element is introduced by an ion implantation method or the like to diffuse the impurity element. In that case, as a method of forming the amorphous silicon film, an LPCVD method, a vapor deposition method, a sputtering method, or the like may be used.

The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced to the amorphous silicon film by a diffusion method or an ion implantation method. Heating or the like may be performed after the impurity element is introduced by an ion implantation method or the like to diffuse the impurity element. In that case, as the method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma CVD method with a frequency of greater than or equal to several tens of megahertz and less than or equal to several hundreds of megahertz, or a microwave plasma-enhanced CVD apparatus with a frequency of greater than or equal to 1 GHz. As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive film. A surface on the n-type semiconductor film side can alternatively be used as the light-receiving plane.

With the use of an insulating material, the insulating film 631, the interlayer insulating film 632, and the insulating film 633 can be formed, depending on the material, by a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 633. The insulating film 633 can be formed by a sputtering method or a plasma CVD method.

The aluminum oxide film which is provided as the insulating film 633 over the oxide semiconductor film has a high blocking effect by which both oxygen and impurities such as hydrogen or moisture are prevented from passing through the film.

Therefore, in and after the manufacturing process, the aluminum oxide film functions as a protective film for preventing entry of impurities such as hydrogen or moisture, which causes change, into the oxide semiconductor film and release of oxygen, which is a main constituent material of the oxide semiconductor, from the oxide semiconductor film.

In this embodiment, in the manufacturing process of the transistor 640, a conductive film provided over a gate electrode layer, an insulating film, and sidewall insulating layers are removed by chemical mechanical polishing treatment, so that the conductive film is divided; thus, a source electrode layer and a drain electrode layer are formed.

Accordingly, the distance between the gate electrode layer and a region (contact region) in which the oxide semiconductor film is in contact with the source electrode layer or the drain electrode layer can be made short, so that the resistance between the gate electrode layer and the region (contact region) in which the oxide semiconductor film is in contact with the source electrode layer or the drain electrode layer is reduced; thus, the on-state characteristics of the transistor 640 can be improved.

Precise processing can be performed accurately because an etching step using a resist mask is not performed in a step for removing the conductive film over the gate electrode layer, which is one step of the formation process of the source electrode layer and the drain electrode layer. Consequently, in a process for manufacturing the semiconductor device, the transistor 640 having a miniaturized structure with less variation in shape or characteristics can be manufactured with high yield.

An inorganic insulating material is used for the insulating film 631, the interlayer insulating film 632, and the insulating film 633. The insulating film 631, the interlayer insulating film 632, and the insulating film 633 can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

To reduce surface roughness, an insulating film functioning as a planarization insulating film is preferably used as the interlayer insulating film 634. For the interlayer insulating film 634, for example, an organic insulating material having heat resistance, such as a polyimide resin, an acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. A light source such as a backlight can be used at the time of reading data on the object.

As described above, a miniaturized and highly-integrated semiconductor device having high electric characteristics and a method for manufacturing the semiconductor device can be provided.

This embodiment can be implemented in appropriate combination with the structures described in the other embodiments.

Embodiment 7

In this embodiment, electronic devices according to an embodiment of the present invention are described. Specifically, electronic devices which include a display panel or a light-emitting panel including the transistor described in the above embodiments are described with reference to FIGS. 15A to 15F.

Examples of an electronic device to which a semiconductor device is applied include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Specific examples of these electronic devices are illustrated in FIGS. 15A to 15F.

Figure 15A:
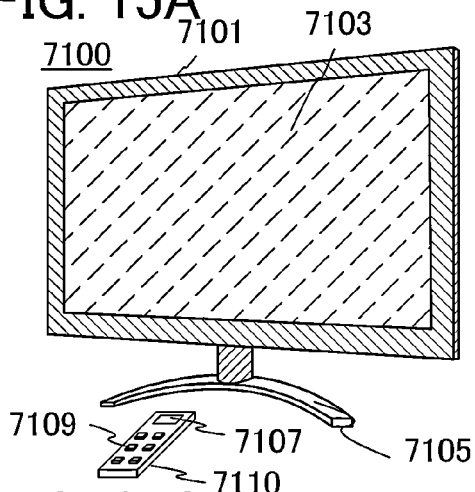
FIGS. 15A to 15F each illustrate an electronic device.

FIG. 15A illustrates an example of a television set. In a television set 7100, a display portion 7103 is incorporated in a housing 7101. Images can be displayed on the display portion 7103, and a display panel can be used for the display portion 7103. In this structure, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

The television set 7100 is provided with a receiver, a modem, and the like. With the use of the receiver, general television broadcasting can be received. Moreover, the television set can be connected to a communication network with or without wires via the modem, whereby one-way (from sender to receiver) or two-way (between sender and receiver or between receivers) data communication can be performed.

Figure 15B:
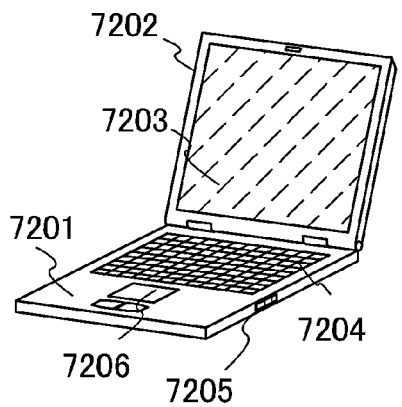

FIG. 15B illustrates a computer, which includes a main body 7201, a housing 7202, a display portion 7203, a keyboard 7204, an external connecting port 7205, a pointing device 7206, and the like. This computer is formed using the display panel for the display portion 7203.

Figure 15C:
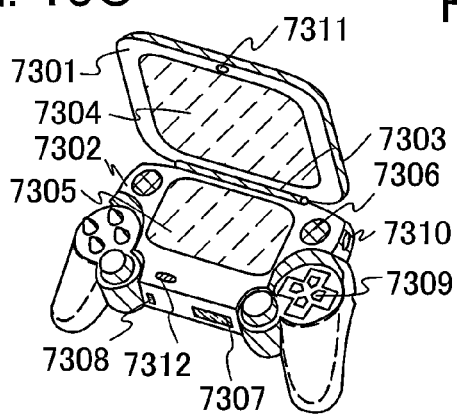

FIG. 15C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 15C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), or a microphone 7312), and the like. It is needless to say that the structure of the portable game machine is not limited to the above as long as the display panel is used for at least either the display portion 7304 or the display portion 7305, or both, and can include other accessories arbitrarily. The portable game machine illustrated in FIG. 15C has a function of reading a program or data stored in a recording medium to display it on the display portion, and a function of sharing information with another portable game machine by wireless communication. The portable game machine illustrated in FIG. 15C can have a variety of functions without limitation to the above.

Figure 15D:
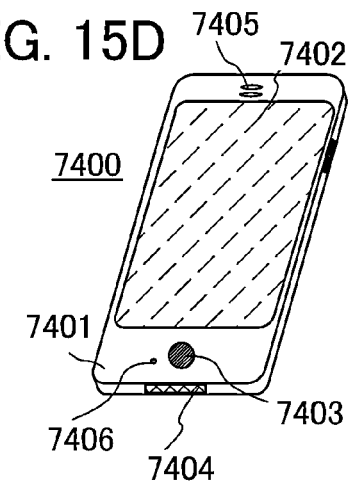

FIG. 15D illustrates an example of a mobile phone. A cellular phone 7400 is provided with a display portion 7402 incorporated in a housing 7401, operation buttons 7403, an external connection port 7404, a speaker 7405, a microphone 7406, and the like. The mobile phone 7400 is manufactured using the display panel for the display portion 7402.

When the display portion 7402 of the cellular phone 7400 illustrated in FIG. 15D is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In that case, it is preferable to display a keyboard or number buttons on almost all the area of the screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 15E:
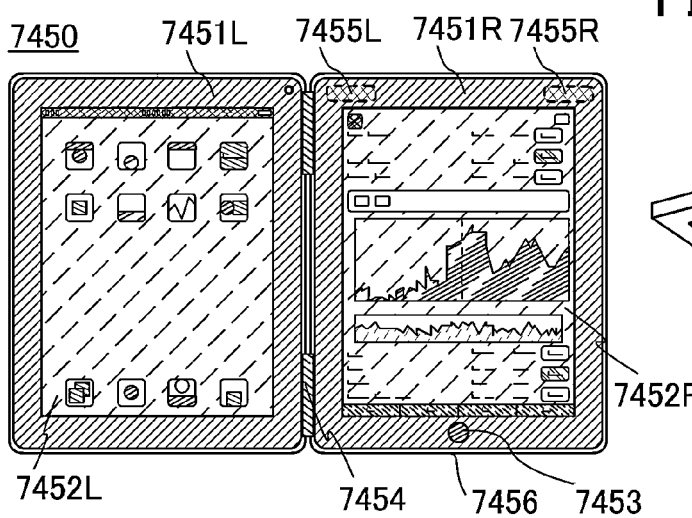

FIG. 15E illustrates an example of a flat shaped computer. A flat shaped computer 7450 includes a housing 7451L and a housing 7451R which are connected to each other by a hinge 7454. Further, in addition to an operation button 7453, a left side speaker 7455L, and a right side speaker 7455R, an external connection port 7456 which is not illustrated is further provided on the side surface of the computer 7450. When the hinge 7454 is folded so that a display portion 7452L provided in the housing 7451L and a display portion 7452R provided in the housing 7451R face each other, the display portions can be protected by the housings.

Each of the display portions 7452L and 7452R is a component which can display images and to which information can be input by touch with a finger or the like. For example, an icon indicating an installed program is selected by touching with a finger, so that a program is started up. Further, when the distance between fingers touching the two portions of the displayed image is changed, the image can be enlarged or shrank. When a finger touching one portion of the displayed image is moved, the image can be moved. When an image of a keyboard is displayed and a displayed letter or symbol is selected by touching with a finger, information can be input.

Further, a gyroscope, an acceleration sensor, a global positioning system (GPS) receiver, a fingerprint sensor, and a video camera can be provided for the computer 7450. When a detection device including a sensor which detects gradients such as a gyroscope or an acceleration sensor is provided, the orientation of an image can be automatically switched by determining the orientation of the computer 7450 (whether the mobile phone is placed horizontally or vertically for a landscape mode or a portrait mode).

Further, the computer 7450 can be connected to a network. The computer 7450 can display the information which is on the internet, and can be used as a remote-control terminal for another device which is connected to a network.

Figure 15F:
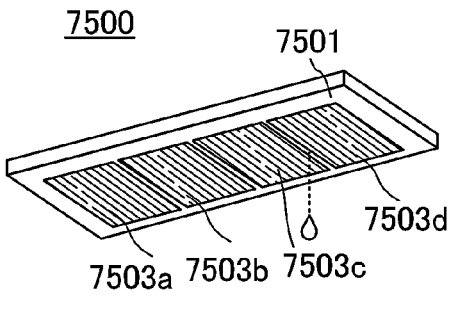

FIG. 15F illustrates an example of a lighting device. In a lighting device 7500, light-emitting panels 7503a to 7503d of an embodiment of the present invention are incorporated in a housing 7501 as light sources. The lighting device 7500 can be attached to a ceiling, a wall, or the like.

The light-emitting device according to an embodiment of the present invention includes a light-emitting panel in a thin film form. Thus, when the light-emitting device is attached to a base with a curved surface, a semiconductor device with a curved surface can be obtained. In addition, when the light-emitting panel is located in a housing with a curved surface, an electronic device or a lighting device with a curved surface can be obtained.

This embodiment can be implemented in appropriate combination with the structures described in the other embodiments.

Example 1

In this example, a transistor described in Embodiment 1 was formed, and a cross-section of the transistor was observed.

As the transistor, Example Transistor 1 which has a similar structure to the transistor 440a illustrated in FIGS. 1A and 1B was formed. A method for manufacturing Example Transistor 1 is described below.

As an insulating layer 11, a 100-nm-thick silicon oxide film was formed over a silicon substrate 10 by a sputtering method (the formation conditions: an atmosphere of oxygen (oxygen=50 sccm), a pressure of 0.4 Pa, a power (power supply output) of 5.0 kW, a distance between the silicon substrate and a target of 60 mm, and a substrate temperature of 100° C.).

As an oxide semiconductor film 12, a 20-nm-thick IGZO film was formed over the silicon oxide film by a sputtering method with the use of an oxide target containing In, Ga, and Zn in the atomic ratio of 3:1:2. The formation conditions were as follows: the atmosphere was an atmosphere of argon and oxygen (argon:oxygen=30 sccm:15 sccm), the pressure was 0.4 Pa, the power was 0.5 kW, and the substrate temperature was 200° C.

Next, as a gate insulating film, a 20-nm-thick silicon oxynitride film was formed over the IGZO film by a CVD method (the formation conditions: an atmosphere of $SiH_4$ and $N_2O$ ($SiH_4$:$N_2O$=1 sccm:800 sccm), a pressure of 40 Pa, a power of the RF power supply (power supply output) of 150 W, a power supply frequency of 60 MHz, and a substrate temperature of 400° C.).

A 100-nm-thick tungsten film was formed over the gate insulating film by a sputtering method (the formation conditions: an atmosphere of argon (argon=100 sccm), a pressure of 0.2 Pa, and a power of 1 kW) and a 200-nm-thick silicon oxynitride film was stacked over the tungsten film by a CVD method (the formation conditions: an atmosphere of $SiH_4$ and $N_2O$ ($SiH_4$:$N_2O$=27 sccm:1000 sccm), a pressure of 133.3 Pa, a power of the RF power supply of 60 W, a power supply frequency of 13.56 MHz, and a substrate temperature of 325° C.).

The silicon oxynitride film was etched by a dry etching method to form an insulating film 15 (the etching conditions: an etching gas of $CF_3$, He, and $CH_4$ ($CF_3$:He:$CH_4$=22.5 sccm:127.5 sccm:5 sccm), a power of the ICP power supply of 475 W, a bias power of 300 W, and a pressure of 3.5 Pa).

Next, the tungsten film was etched by a dry etching method to form a gate electrode layer 14 (the etching conditions: an etching gas of $CF_4$, $Cl_2$, and $O_2$ ($CF_4$:$Cl_2$:$O_2$=25 sccm:25 sccm:10 sccm), a power of the ICP power supply of 500 W, a bias power of 100 W, a pressure of 1.0 Pa, and a substrate temperature of 70° C.).

As an insulating film, a 70-nm-thick silicon oxynitride film was formed over the gate electrode layer 14 and the insulating film 15 by a CVD method (the formation conditions: an atmosphere of $SiH_4$ and $N_2O$ ($SiH_4$:$N_2O$=1 sccm:800 sccm), a pressure of 40 Pa, a power of the RF power (power supply output) of 150 W, a power supply frequency of 60 MHz, and a substrate temperature of 400° C.). Further, the silicon oxynitride film was etched by a dry etching method (the etching conditions: an etching gas of $CHF_3$ and He ($CHF_3$:He=56 sccm:144 sccm), a power of the ICP power supply of 25 W, a bias power of 425 W, a pressure of 7.5 Pa, and a substrate temperature of 70° C.). Accordingly, sidewall insulating layers 16a and 16b were formed. The gate insulating film was etched with the use of the gate electrode layer 14 and the sidewall insulating layers 16a and 16b as masks, so that a gate insulating film 13 was formed.

A 30-nm-thick tungsten film was formed over the oxide semiconductor film 12, the gate insulating film 13, the sidewall insulating layers 16a and 16b, and the insulating film 15 by a sputtering method (the formation conditions: an atmosphere of argon (argon=80 sccm), a pressure of 0.8 Pa, a power of 1 kW, and a substrate temperature of 230° C.).

A 500-nm-thick silicon oxynitride film was formed over the tungsten film by a CVD method (the formation conditions: an atmosphere of $SiH_4$ and $N_2O$ ($SiH_4$:$N_2O$=27 sccm:1000 sccm), a pressure of 133.3 Pa, a power of the RF power supply of 60 W, a power supply frequency of 13.56 MHz, and a substrate temperature of 325° C.).

Next, the silicon oxynitride film and the tungsten film were polished by a chemical mechanical polishing method (the polishing conditions: a hard polyurethane-based polishing cloth, alkaline silica-based slurry, a slurry temperature of room temperature, a polishing pressure of 0.08 MPa, a rotation number in polishing (table/spindle) of 50 rpm/50 rpm, and a polishing time of 2 minutes), so that the silicon oxynitride film and the tungsten film which was over the gate electrode layer 14 were removed to expose the insulating film 15.

By the polishing treatment, the silicon oxynitride film was processed to form an insulating film 18, and the tungsten film was divided to form a source electrode layer 17a and a drain electrode layer 17b.

Through the process, Example Transistor 1 was formed.

Figure 16:
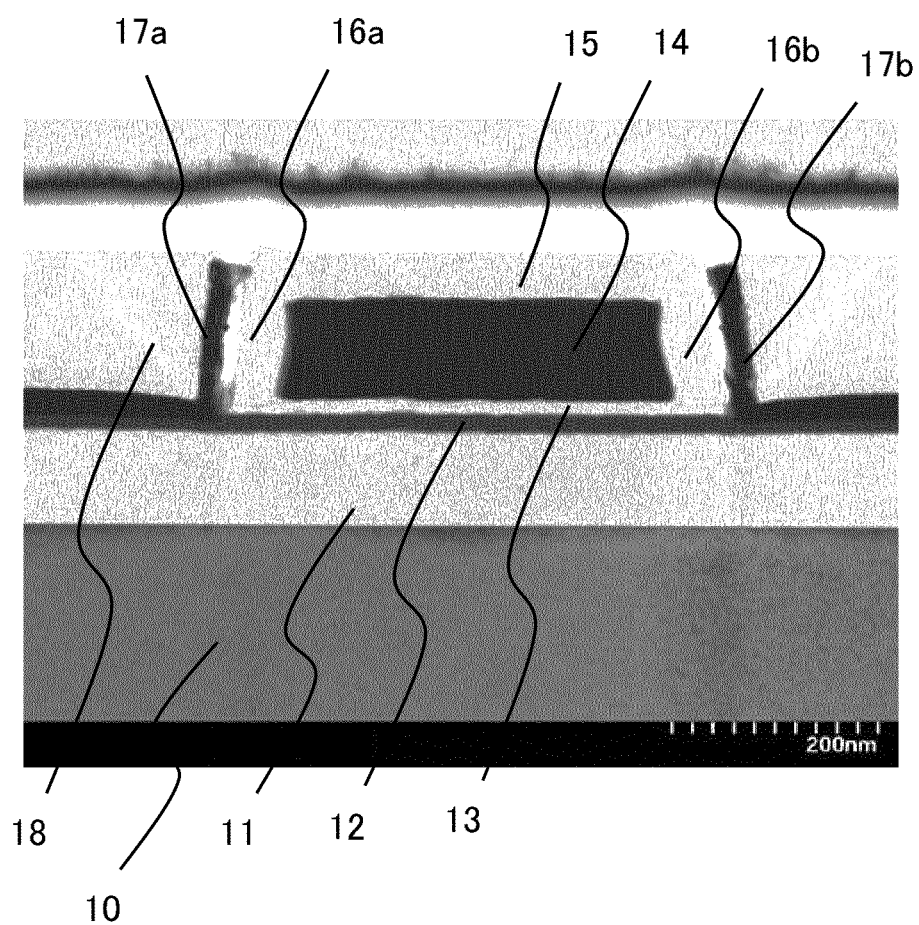
FIG. 16 shows a cross-sectional STEM image of Example Transistor 1.

An end face of Example Transistor 1 was cut, and a cross section of Example Transistor 1 was observed using a scanning transmission electron microscopy (STEM). In this example, as the STEM, an Ultra-thin Film Evaluation System HD-2300 manufactured by Hitachi High-Technologies Corporation was used. FIG. 16 illustrates a cross-sectional STEM image of Example Transistor 1.

FIG. 16 is the cross-sectional STEM image of Example Transistor 1 in the channel length direction, and it can be confirmed that that the source electrode layer 17a and the drain electrode layer 17b are separated by the polishing treatment. The source electrode layer 17a and the drain electrode layer 17b are provided in contact with side surfaces of the sidewall insulating layers 16a and 16b provided on side surfaces of the gate electrode layer 14, and in this example, the source electrode layer 17a and the drain electrode layer 17b each of which has an upper end portion positioned a little lower than those of the sidewall insulating layers 16a and 16b cover the side surfaces of the sidewall insulating layers 16a and 16b. The shapes of the source electrode layer 17a and the drain electrode layer 17b depend on the conditions of the polishing treatment for dividing the conductive film, and in some cases, the source electrode layer 17a and the drain electrode layer 17b are depressed in the film thickness direction from the surfaces of the sidewall insulating layers 16a and 16b and the insulating film 15 which are polished was performed as shown in this example.

Note that in FIG. 16, the width of the lower base of the gate electrode layer 14 which is trapezoid is approximately 382 nm and the width of the upper base thereof is approximately 364 nm, the width of the sidewall insulating layers 16a and 16b in the channel length direction is approximately 51.6 nm, the thickness of the insulating film 15 which is provided over the gate electrode layer 14 is approximately 44.1 nm, the thickness of the insulating film 18, which is from a portion where the source electrode layer 17a or the drain electrode layer 17b is in contact with the oxide semiconductor film 12 to the surface of the insulating film 18, is approximately 139.8 nm.

In Example Transistor 1, a conductive film provided over the gate electrode layer 14, the insulating film 15, and the sidewall insulating layers 16a and 16b was removed by chemical mechanical polishing treatment, so that the conductive film was divided; thus, the source electrode layer 17a and the drain electrode layer 17b are formed.

Accordingly, the distance between the gate electrode layer 14 and a region (contact region) in which the oxide semiconductor film 12 is in contact with the source electrode layer 17a or the drain electrode layer 17b can be made short, so that the resistance between the gate electrode layer 14 and the region (contact region) in which the oxide semiconductor film 12 is in contact with the source electrode layer 17a or the drain electrode layer 17b is reduced; thus, the on-state characteristics of the transistor can be improved.

Precise processing can be performed accurately because an etching step using a resist mask is not performed in a step for removing the conductive film over the gate electrode layer 14, which was one step of the formation process of the source electrode layer 17a and the drain electrode layer 17b. Consequently, in a process for manufacturing the semiconductor device, a transistor having a miniaturized structure with less variation in shape or characteristics can be manufactured with high yield.

As described in this example, a miniaturized transistor having high electric characteristics can be provided with high yield. In addition, a semiconductor device including the transistor can have high performance, high reliability, and high productivity.

Example 2

In this example, a transistor according to one embodiment of the semiconductor device disclosed in this specification was formed and the electric characteristics were evaluated.

Figure 17:
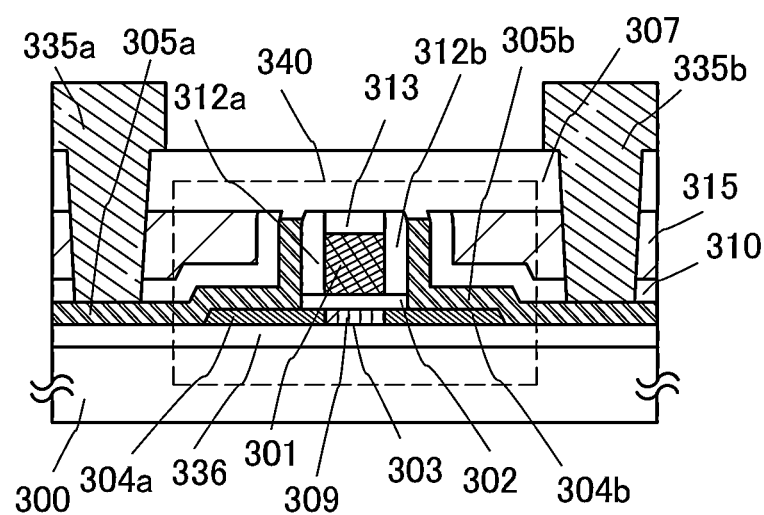
FIG. 17 illustrates a structure of Example Transistor 2.

As the transistor, Example Transistor 2 which has a similar structure to a transistor 340 illustrated in FIG. 17 was formed. A method for manufacturing Example Transistor 2 is described below.

As an insulating film 336, a 300-nm-thick silicon oxide film was formed over a silicon substrate 300 by a sputtering method (the formation conditions: an atmosphere of oxygen (oxygen=50 sccm), a pressure of 0.4 Pa, a power (power supply output) of 1.5 kW, a distance between the silicon substrate and a target of 60 mm, and a substrate temperature of 100° C.).

Polishing treatment was performed on a surface of the insulating film 336 by a chemical mechanical polishing method (the polishing pressure was 0.08 MPa and the polishing time was 0.5 minutes).

As an oxide semiconductor film, a 10-nm-thick IGZO film was formed over the insulating film 336 subjected to the polishing treatment, by a sputtering method with the use of an oxide target containing In, Ga, and Zn in the atomic ratio of 3:1:2. The formation conditions were as follows: the atmosphere was an atmosphere of argon and oxygen (argon:oxygen=30 sccm:15 sccm), the pressure was 0.4 Pa, the power was 0.5 kW, and the substrate temperature was 200° C.

Next, the oxide semiconductor film was etched by a dry etching method to form an island-shaped oxide semiconductor film 303 (the etching conditions: an etching gas of $BCL_3$ and $Cl_2$ ($BCL_3$:$Cl_2$=60 sccm:20 sccm), a power of the ICP power supply of 450 W, a bias power of 100 W, and a pressure of 1.9 Pa).

Next, as the gate insulating film, a 20 nm-thick silicon oxynitride film was formed over the island-shaped oxide semiconductor film 303 by a CVD method (the formation conditions: an atmosphere of $SiH_4$ and $N_2O$ ($SiH_4$:$N_2O$=1 sccm:800 sccm), a pressure of 40 Pa, a power of the RF power supply (power supply output) of 150 W, a power supply frequency of 60 MHz, and a substrate temperature of 400° C.).

A stack of a 30-nm-thick tantalum nitride film and a 135-nm-thick tungsten film were formed over the gate insulating film by a sputtering method. The formation conditions of the tantalum nitride film were as follows: the atmosphere was an atmosphere of argon and nitrogen (argon:nitrogen=50 sccm:10 sccm), the pressure was 0.6 Pa, and the power was 1 kW. The formation conditions of the tungsten film were as follows: the atmosphere was an atmosphere of argon (argon=100 sccm), the pressure was 2.0 Pa, and the power was 4 kW.

Next, a 200-nm-thick silicon oxynitride film was stacked over the tungsten film by a CVD method (the formation conditions: an atmosphere of $SiH_4$ and $N_2O$ ($SiH_4$:$N_2O$=27 sccm:1000 sccm), a pressure of 133.3 Pa, a power of the RF power supply of 60 W, a power supply frequency of 13.56 MHz, and a substrate temperature of 325° C.).

The silicon oxynitride film was etched by a dry etching method to form an insulating film 313 (the etching conditions: an etching gas of $CHF_3$, He, and $CH_4$ ($CHF_3$:He:$CH_4$=22.5 sccm:127.5 sccm:5 sccm), a power of the ICP power supply of 475 W, a bias power of 300 W, and a pressure of 3.5 Pa).

The tantalum nitride film and the tungsten film were etched by dry etching methods, so that a gate electrode layer 301 was formed. The first etching conditions were as follows: the etching gas was $CF_4$, $Cl_2$, and $O_2$ ($CF_4$:$Cl_2$:$O_2$=25 sccm:25 sccm:10 sccm), the power of the ICP power supply was 500 W, the bias power was 100 W, and the pressure was 1.0 Pa. The second etching conditions were as follows: the etching gas was $Cl_2$ ($Cl_2$=100 sccm), the power was 2 kW, the bias power was 50 W, and the pressure was 1.0 Pa. The third etching conditions were as follows: the etching gas was $Cl_2$ ($Cl_2$=100 sccm), the power was 1 kW, the bias power was 25 W, and the pressure was 2.0 Pa).

Phosphorus (P) ions were implanted into the oxide semiconductor film 303 by an ion implantation method with the use of gate electrode layer 301 as a mask, whereby low-resistance regions 304a and 304b are formed. Note that the conditions of the phosphorus (P) ion implantation were as follows: the acceleration voltage was 25 kV and the dosage was $1.0 \times 10^{15}$ ions/$cm^2$.

As an insulating film, a 90-nm-thick silicon oxynitride film was formed over the gate electrode layer 301 and the insulating film 313 by a CVD method (the formation conditions: an atmosphere of $SiH_4$ and $N_2O$ ($SiH_4$:$N_2O$=1 sccm:800 sccm), a pressure of 40 Pa, a power of the RF power supply (power supply output) of 150 W, a power supply frequency of 60 MHz, and a substrate temperature of 400° C.). Then, the silicon oxynitride film was etched by a dry etching method to form sidewall insulating layers 312a and 312b. The gate insulating film was etched with the use of the gate electrode layer 301 and the sidewall insulating layers 312a and 312b as masks, so that a gate insulating film 302 was formed. The etching conditions used for forming the sidewall insulating layers 312a and 312b and the gate insulating film 302 were as follows: the etching gas was $CHF_3$ and He ($CHF_3$:He=30 sccm:120 sccm), the power of the power supply was 3 kW, the bias power was 200 W, the pressure was 2.0 Pa, and the substrate temperature was −10° C.)

A 30-nm-thick tungsten film was formed over the oxide semiconductor film 303, the gate electrode layer 301, the sidewall insulating layers 312a and 312b, and the insulating film 313 by a sputtering method (the formation conditions: an atmosphere of argon (argon=80 sccm), a pressure of 0.8 Pa, a power of 1 kW, and a substrate temperature of 230° C.).

Next, a tungsten film was etched by a dry etching method (the etching conditions: an etching gas of $CF_4$, $Cl_2$, and $O_2$ ($CF_4$:$Cl_2$:$O_2$=55 sccm:45 sccm:55 sccm), a power of 3 kW, a bias power of 140 W, and a pressure of 0.67 Pa), so that an island-shaped tungsten film was formed.

Next, as an insulating film, a 70-nm-thick aluminum oxide film was formed over the oxide semiconductor film 303, the gate electrode layer 301, the sidewall insulating layers 312a and 312b, the insulating film 313, and the tungsten film by a sputtering method. The formation conditions were as follows: the atmosphere was an atmosphere of argon and oxygen (argon:oxygen=25 sccm:25 sccm), the pressure was 0.4 Pa, the power was 2.5 kW, a distance between the silicon substrate and a target was 60 mm, and the substrate temperature was 250° C.

A 430-nm-thick silicon oxynitride film was formed over the aluminum oxide film by a CVD method (the formation conditions: an atmosphere of $SiH_4$ and $N_2O$ ($SiH_4$:$N_2O$=27 sccm:1000 sccm), a pressure of 133.3 Pa, a power of the RF power supply of 60 W, a power supply frequency of 13.56 MHz, and a substrate temperature of 325° C.).

Next, the silicon oxynitride film, the aluminum oxide film, and the tungsten film were polished by a chemical mechanical polishing method (the polishing conditions: a hard polyurethane-based polishing cloth, alkaline silica-based slurry, a slurry temperature of room temperature, a polishing pressure of 0.08 MPa, and a rotation number in polishing (table/spindle) of 51 rpm/50 rpm), so that the silicon oxynitride film, the aluminum oxide film, and the tungsten film each of which was over the gate electrode layer 301 were removed to expose the insulating film 313.

By the polishing treatment, the silicon oxynitride film was processed to form an insulating film 315, the aluminum oxide film was processed to form an insulating film 310, and the tungsten film was divided to form a source electrode layer 305a and a drain electrode layer 305b.

As an insulating film 307, a 400-nm-thick silicon oxynitride film was formed over the gate electrode layer 301, the insulating film 313, the source electrode layer 305a, the drain electrode layer 305b, the insulating film 310, and the insulating film 315 by a CVD method (the formation conditions: an atmosphere of $SiH_4$ and $N_2O$ ($SiH_4$:$N_2O$=27 sccm:1000 sccm), a pressure of 133.3 Pa, a power of the RF power supply of 60 W, a power supply frequency of 13.56 MHz, and a substrate temperature of 325° C.).

Openings reaching the source electrode layer 305a and the drain electrode layer 305b were formed in the insulating film 307, the insulating film 315, and the insulating film 310 (the first etching conditions: an etching gas of $CHF_3$ and He ($CHF_3$:He=7.5 sccm:142.5 sccm), a power of the ICP power supply of 475 W, a bias power of 300 W, a pressure of 5.5 Pa, and a time of 192 seconds; and the second etching conditions: an etching gas of $CHF_3$ and He ($CHF_3$:He=7.5 sccm:142.5 sccm), a power of the ICP power supply of 475 W, a bias power of 150 W, a pressure of 5.5 Pa, and a time of 78 seconds).

In the openings, a 50-nm-thick titanium film (the formation conditions: an atmosphere of argon (argon=20 sccm), a pressure of 0.1 Pa, and a power of 12 kW), a 100-nm-thick aluminum film (the formation conditions: an atmosphere of argon (argon=50 sccm), a pressure of 0.4 Pa, and a power of 1 kW), and a 50-nm-thick titanium film (the formation conditions: an atmosphere of argon (argon=20 sccm), a pressure of 0.1 Pa, and a power of 12 kW) were stacked by a sputtering method.

The stack of the titanium film, the aluminum film, and the titanium film was etched (the etching conditions: an etching gas of $BCL_3$ and $Cl_2$ ($BCL_3$:$Cl_2$=60 sccm:20 sccm), a power of the ICP power supply of 450 W, a bias power of 100 W, and a pressure of 1.9 Pa), so that wiring layers 335a and 335b were formed.

Through the above steps, a transistor 340 was formed as Example Transistor 2.

Note that in Example Transistor 2, the channel width (W) was 10 μm, the distance between the gate electrode layer 301 and an opening in which the oxide semiconductor film 303 was in contact with the source electrode layer 305a or the drain electrode layer 305b was 0.07 μm.

The electric characteristics of Example Transistor 2 were evaluated.

Figure 18:
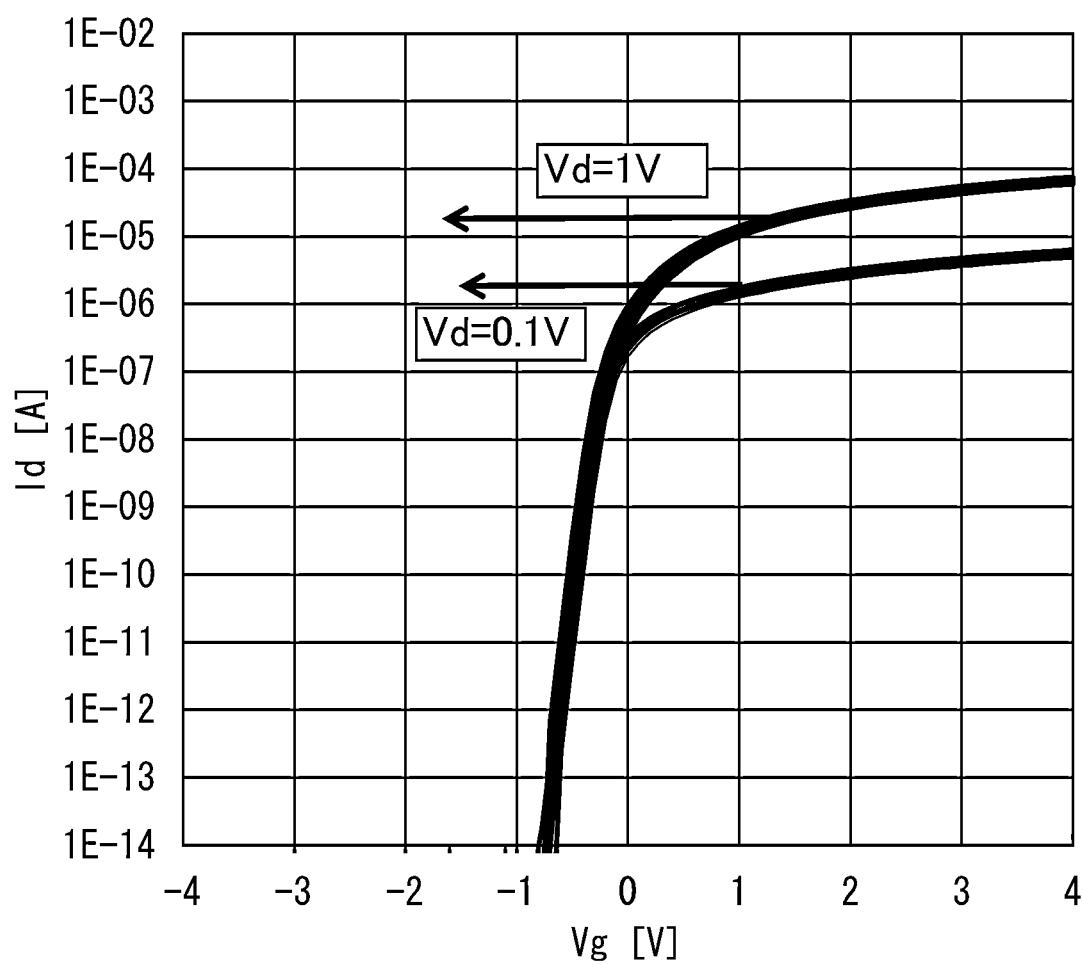
FIG. 18 shows electric characteristics of Example Transistor 2.

FIG. 18 shows gate voltage ($V_g$)-drain current ($I_d$) characteristics when the drain voltage ($V_d$) was 1 V, and gate voltage ($V_g$)-drain current ($I_d$) characteristics when the drain voltage ($V_d$) was 0.1 V. Note that FIG. 18 shows the electric characteristics of Example Transistor 2 in which a case where the channel length (L) was 0.35 μm and the measurement range was a gate voltage from −4 to +4.

As shown in FIG. 18, Example Transistor 2 shows electric characteristics as a switching element, and when the drain voltage ($V_d$) is 1 V and the gate voltage ($V_g$) is 2.7 V, the on-state current of Example Transistor 2 is 45.1 μA, the threshold voltage ($V_{th}$) is −0.27 V, the subthreshold swing (S value) is 73.8 mV/dec., and when the drain voltage ($V_d$) is 0.1 V, the field effect mobility is 3.0 $cm^2$/Vs. Note that the on-state current, the threshold voltage ($V_{th}$), the subthreshold swing (S value), and the field effect mobility are each a median value of the measured data.

In-plane variation was evaluated in the case where the electric characteristics of Example Transistor 2 were measured at 100 points.

Figure 21:
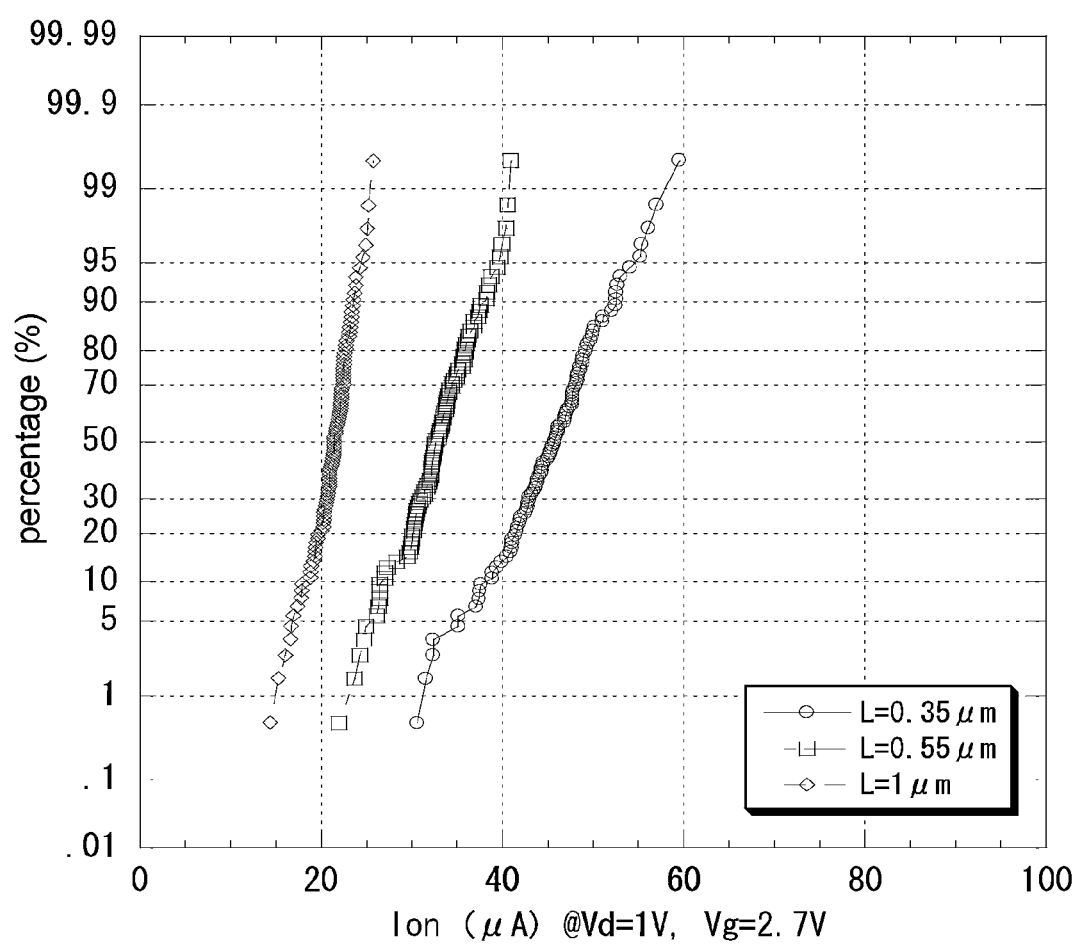
FIG. 21 shows a graph of normal probability distribution of an on-state current in Example Transistor 2.

FIG. 21 shows a normal probability graph of the on-state current when the drain voltage is 1 V and the gate voltage ($V_g$) is 2.7 V. When the variation of the on-state current is denoted by 3σ, in a case of the channel length of 0.35 μm, 3σ is 16.5 μA and the percentage of 3σ divided by a median value is 36.3%, in a case of the channel length of 0.55 μm, 3σ is 11.8 μA and the percentage of 3σ divided by a median value is 36.0%, and in a case of the channel length of 1 μm, 3σ is 6.4 μA and the percentage of 3σ divided by a median value is 30.0%.

Figure 22:
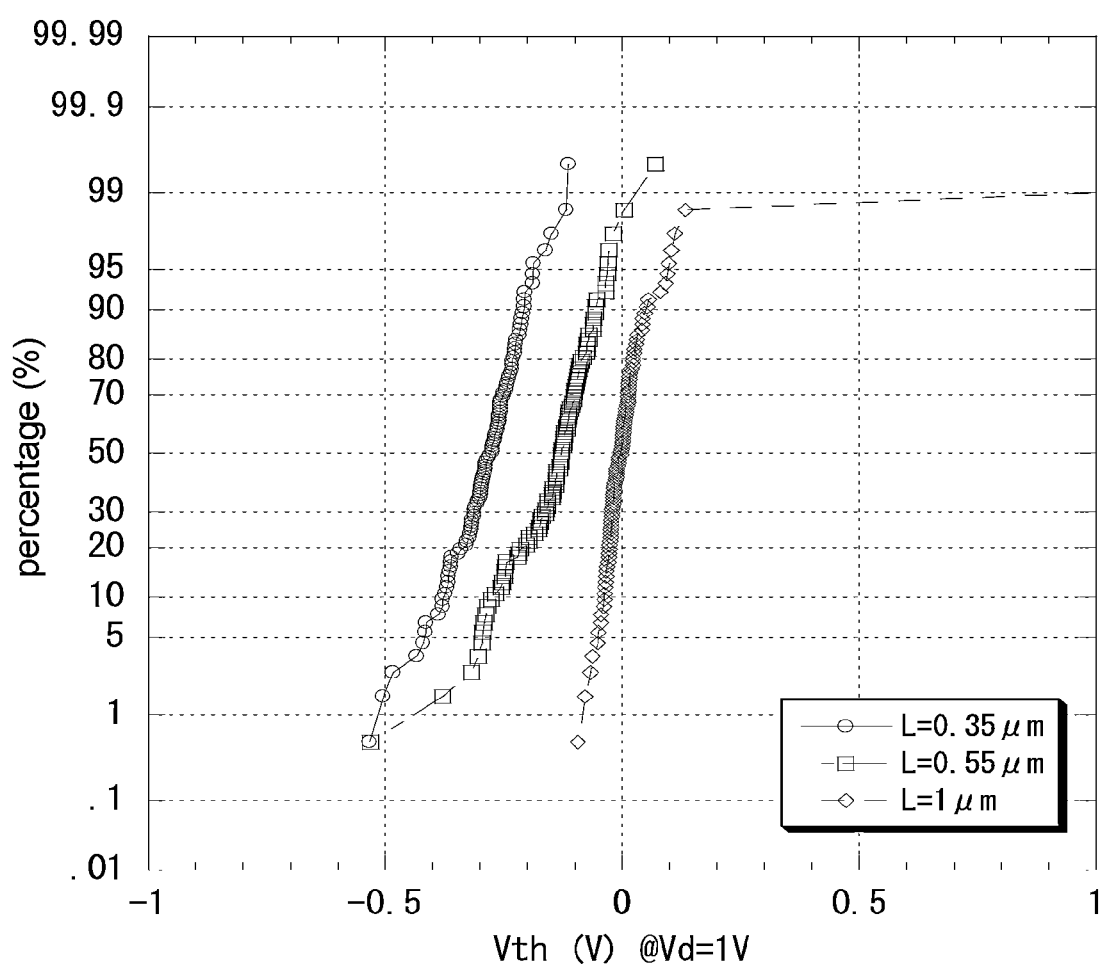
FIG. 22 shows a graph of normal probability distribution of a threshold voltage in Example Transistor 2.

FIG. 22 shows a normal probability graph of the threshold voltage when the drain voltage is 1 V. When the variation of the threshold voltage is denoted by 3σ, in a case of the channel length of 0.35 μm, 3σ is 0.22 V, in a case of the channel length of 0.55 μm, 3σ is 0.26 V, and in a case of the channel length of 1 μm, 3σ is 0.12V.

From the results shown in FIG. 21 and FIG. 22, the slopes in the graphs are large in both the on-state current and the threshold voltage, and the variation is small.

Accordingly, the transistor of this example has sufficient electronic characteristics as a switching element and less variation in electronic characteristics even though the transistor has a miniaturized structure in which the channel length is 0.35 μm.

As described in this example, a miniaturized transistor having high electric characteristics can be provided with high yield. In addition, a semiconductor device including the transistor can have high performance, high reliability, and high productivity.

This application is based on Japanese Patent Application serial No. 2011-208229 filed with Japan Patent Office on Sep. 23, 2011 and Japanese Patent Application serial No. 2011-225519 filed with Japan Patent Office on Oct. 13, 2011, the entire contents of which are hereby incorporated by reference.

What is claimed is:

1. A method for manufacturing a semiconductor device comprising steps of:
   forming an oxide insulating film;
   forming an oxide semiconductor film over the oxide insulating film;
   forming a gate insulating film over the oxide semiconductor film;
   forming a gate electrode layer and a first insulating film overlapping with the oxide semiconductor film over the gate insulating film;
   selectively introducing a dopant into the oxide semiconductor film using the gate electrode layer and the first insulating film as masks;
   forming a sidewall insulating layer covering a side surface of the gate electrode layer and a side surface of the first insulating film over the gate insulating film;
   forming a conductive film over the oxide semiconductor film, the gate insulating film, the gate electrode layer, the first insulating film, and the sidewall insulating layer;
   forming an interlayer insulating film over the conductive film; and
   removing the interlayer insulating film and the conductive film by a chemical mechanical polishing method to expose the gate electrode layer and form a source electrode layer and a drain electrode layer, and to form a groove between the interlayer insulating film and the sidewall insulating layer,
   forming a second insulating film so that the second insulating film fills the groove and is in contact with the source electrode layer and the drain electrode layer, wherein a top surface of the source electrode layer and a top surface of the drain electrode layer are lower than a top surface of the sidewall insulating layer and a top surface of the interlayer insulating film, wherein the top surface of the sidewall insulating layer and the top surface of the interlayer insulating film are aligned with each other, wherein an outer surface of each of the source electrode layer and the drain electrode layer is stepped, wherein an inner surface of each of the source electrode layer and the drain electrode layer is in direct contact with the sidewall insulating layer and the oxide semiconductor film, and wherein the outer surface of each of the source electrode layer and the drain electrode layer is opposite to the inner surface of each of the source electrode layer and the drain electrode layer.

2. The method for manufacturing a semiconductor device according to claim 1, wherein planarization treatment is performed on a surface of the oxide insulating film before the oxide semiconductor film is formed.

3. The method for manufacturing a semiconductor device according to claim 1, wherein oxygen is introduced to the oxide insulating film before the sidewall insulating layer is formed.

4. A method for manufacturing a semiconductor device comprising steps of:

forming an oxide insulating film;

forming an oxide semiconductor film over the oxide insulating film;

forming a gate insulating film over the oxide semiconductor film;

forming a gate electrode layer and a first insulating film overlapping with the oxide semiconductor film over the gate insulating film;

selectively introducing a dopant into the oxide semiconductor film using the gate electrode layer and the first insulating film as masks;

forming a sidewall insulating layer covering a side surface of the gate electrode layer and a side surface of the first insulating film over the gate insulating film;

forming a conductive film over the oxide semiconductor film, the gate insulating film, the gate electrode layer, the first insulating film, and the sidewall insulating layer;

forming an interlayer insulating film over the conductive film; and removing the interlayer insulating film and the conductive film by a chemical mechanical polishing method to expose the first insulating film over the gate electrode layer and form a source electrode layer and a drain electrode layer, and to form a groove between the interlayer insulating film and the sidewall insulating layer, forming a second insulating film so that the second insulating film fills the groove and is in contact with the source electrode layer and the drain electrode layer, wherein a top surface of the source electrode layer and a top surface of the drain electrode layer are lower than a top surface of the first insulating film, a top surface of the sidewall insulating layer, and a top surface of the interlayer insulating film, wherein the top surface of the first insulating film, the top surface of the sidewall insulating layer, and the top surface of the interlayer insulating film are aligned with each other, wherein an outer surface of each of the source electrode layer and the drain electrode layer is stepped, wherein an inner surface of each of the source electrode layer and the drain electrode layer is in direct contact with the sidewall insulating layer and the oxide semiconductor film, and wherein the outer surface of each of the source electrode layer and the drain electrode layer is opposite to the inner surface of each of the source electrode layer and the drain electrode layer.

5. The method for manufacturing a semiconductor device according to claim 4, wherein planarization treatment is performed on a surface of the oxide insulating film before the oxide semiconductor film is formed.

6. The method for manufacturing a semiconductor device according to claim 4, wherein oxygen is introduced to the oxide insulating film before the sidewall insulating layer is formed.

7. The method for manufacturing a semiconductor device according to claim 1, wherein the second insulating film comprises an aluminum oxide film.

8. The method for manufacturing a semiconductor device according to claim 4, wherein the second insulating film comprises an aluminum oxide film.

* * * * *